US012399150B2

(12) United States Patent
Subramanian

(10) Patent No.: US 12,399,150 B2
(45) Date of Patent: Aug. 26, 2025

(54) ATOMIC-TO-NANOSCALE MATTER EMISSION / FLOW REGULATION DEVICE

(71) Applicant: The Board of Trustees of the University of Illinois, Urbana, IL (US)

(72) Inventor: Arunkumar Subramanian, Chicago, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 727 days.

(21) Appl. No.: 17/608,020

(22) PCT Filed: May 4, 2020

(86) PCT No.: PCT/US2020/031373
§ 371 (c)(1),
(2) Date: Nov. 1, 2021

(87) PCT Pub. No.: WO2020/223734
PCT Pub. Date: Nov. 5, 2020

(65) Prior Publication Data
US 2022/0347749 A1 Nov. 3, 2022

Related U.S. Application Data

(60) Provisional application No. 62/842,259, filed on May 2, 2019, provisional application No. 62/846,892, filed on May 13, 2019.

(51) Int. Cl.
*G01N 27/62* (2021.01)
*B22F 10/20* (2021.01)
(Continued)

(52) U.S. Cl.
CPC ............. *G01N 27/62* (2013.01); *B22F 10/20* (2021.01); *B22F 12/53* (2021.01); *B33Y 10/00* (2014.12); *B33Y 30/00* (2014.12); *H01L 21/6708* (2013.01)

(58) Field of Classification Search
CPC ......... G01N 27/62; B22F 10/20; B22F 12/53; B22F 2999/00; B22F 1/0545; B22F 10/10;
(Continued)

(56) References Cited

U.S. PATENT DOCUMENTS 4,658,269 A 4/1987 Rezanka
6,089,700 A * 7/2000 Ahn ..................... B41J 2/14129
347/61

(Continued)

OTHER PUBLICATIONS

IP Search Report.*
(Continued)

*Primary Examiner* — Yasser A Abdelaziz
(74) *Attorney, Agent, or Firm* — Thomas | Horstemeyer, LLP

(57) ABSTRACT

Atomic-to-Nanoscale Matter Emission/Flow Regulation Devices, Systems and methods are set forth. An exemplary device can include a through-hole that has a top, and a nozzle configured to facilitate atomic-to-nanoscale matter emission/flow regulation formed in an etchable nozzle substrate. The nozzle can be configured at the smallest cross-section of the through-hole. A bottom can be formed in the nozzle substrate or selectively connected to the nozzle. Systems can include matter transportation/flow regulation columns, printing systems, etching systems and the like through which self-aligned nanodroplets or single-to-finite numbered ionic species/gas phase matter can flow under spontaneous or external excitation conditions (such as voltages) at atmospheric as well as regulated pressures.

19 Claims, 27 Drawing Sheets

(51) Int. Cl.
*B22F 12/53* (2021.01)
*B33Y 10/00* (2015.01)
*B33Y 30/00* (2015.01)
*H01L 21/67* (2006.01)

(58) Field of Classification Search
CPC .......... B22F 10/30; B22F 10/38; B33Y 10/00; B33Y 30/00; H01L 21/6708; B82Y 40/00; B41J 2002/14491; B41J 2202/04; B41J 2/1631; B41J 2/16; B41J 2/06; B41J 2/09; B41J 2/1628; B41J 2/1629; B41J 2/1632
See application file for complete search history.

(56) References Cited

U.S. PATENT DOCUMENTS

| | | | | |
|---|---|---|---|---|
| 6,189,214 | B1 * | 2/2001 | Skeath | B05B 7/00 261/78.2 |
| 6,672,708 | B2 * | 1/2004 | Silverbrook | B41J 2/1637 347/54 |
| 7,665,829 | B2 * | 2/2010 | Ueno | B41J 2/14233 347/68 |
| 8,138,665 | B2 * | 3/2012 | Holland | H01J 3/021 445/51 |
| 2003/0146757 | A1 | 8/2003 | Aguero et al. | |
| 2007/0075240 | A1 * | 4/2007 | Hieke | G21K 5/02 250/282 |
| 2011/0155574 | A1 * | 6/2011 | Golovchenko | C12Q 1/6869 204/601 |
| 2011/0187798 | A1 | 8/2011 | Rogers et al. | |
| 2013/0287962 | A1 | 10/2013 | Deng et al. | |
| 2015/0158300 | A1 | 6/2015 | Ueda et al. | |
| 2015/0290938 | A1 | 10/2015 | Rogers et al. | |
| 2017/0219522 | A1 | 8/2017 | Furtaw et al. | |
| 2018/0009223 | A1 | 1/2018 | Poulikakos et al. | |
| 2018/0178174 | A1 | 6/2018 | Link et al. | |

OTHER PUBLICATIONS

International Search Report for PCT/US2020/031373 mailed Aug. 14, 2020.
Supplementary European Search Report for EP20798250 mailed Apr. 18, 2023.

* cited by examiner

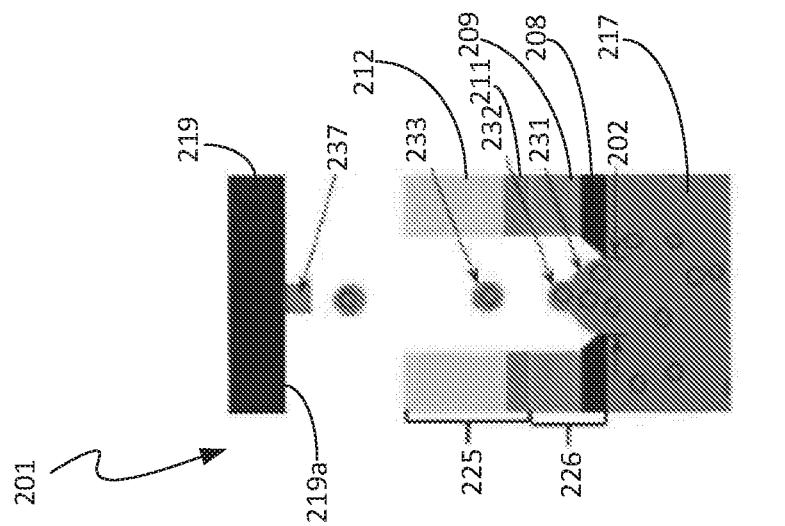
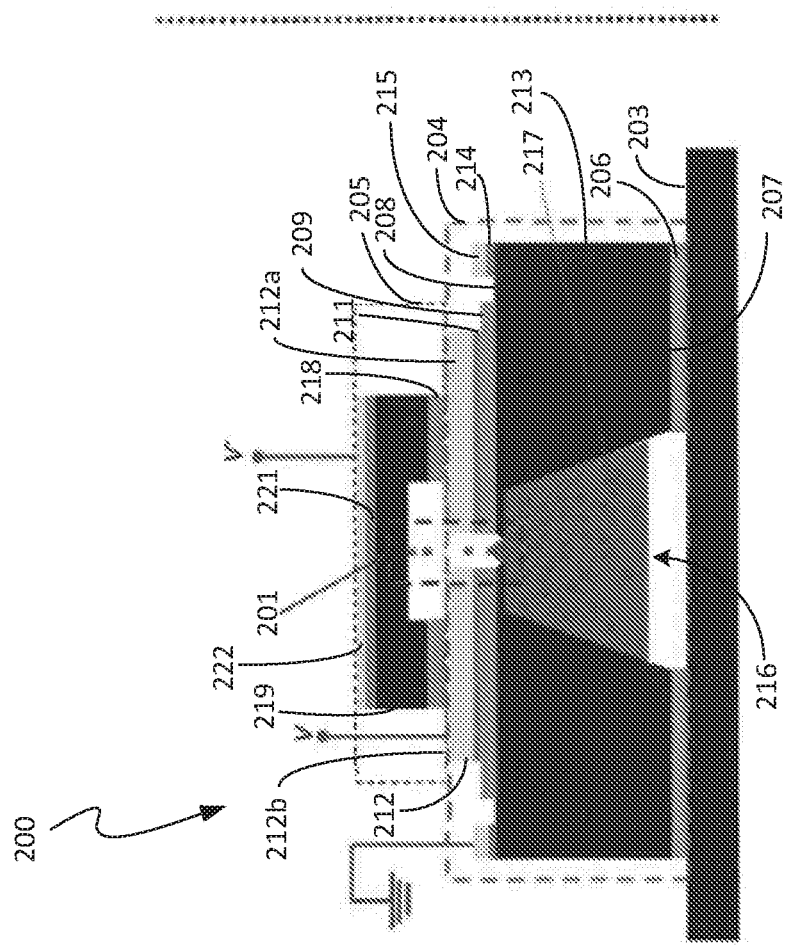
FIG. 2B
FIG. 2A

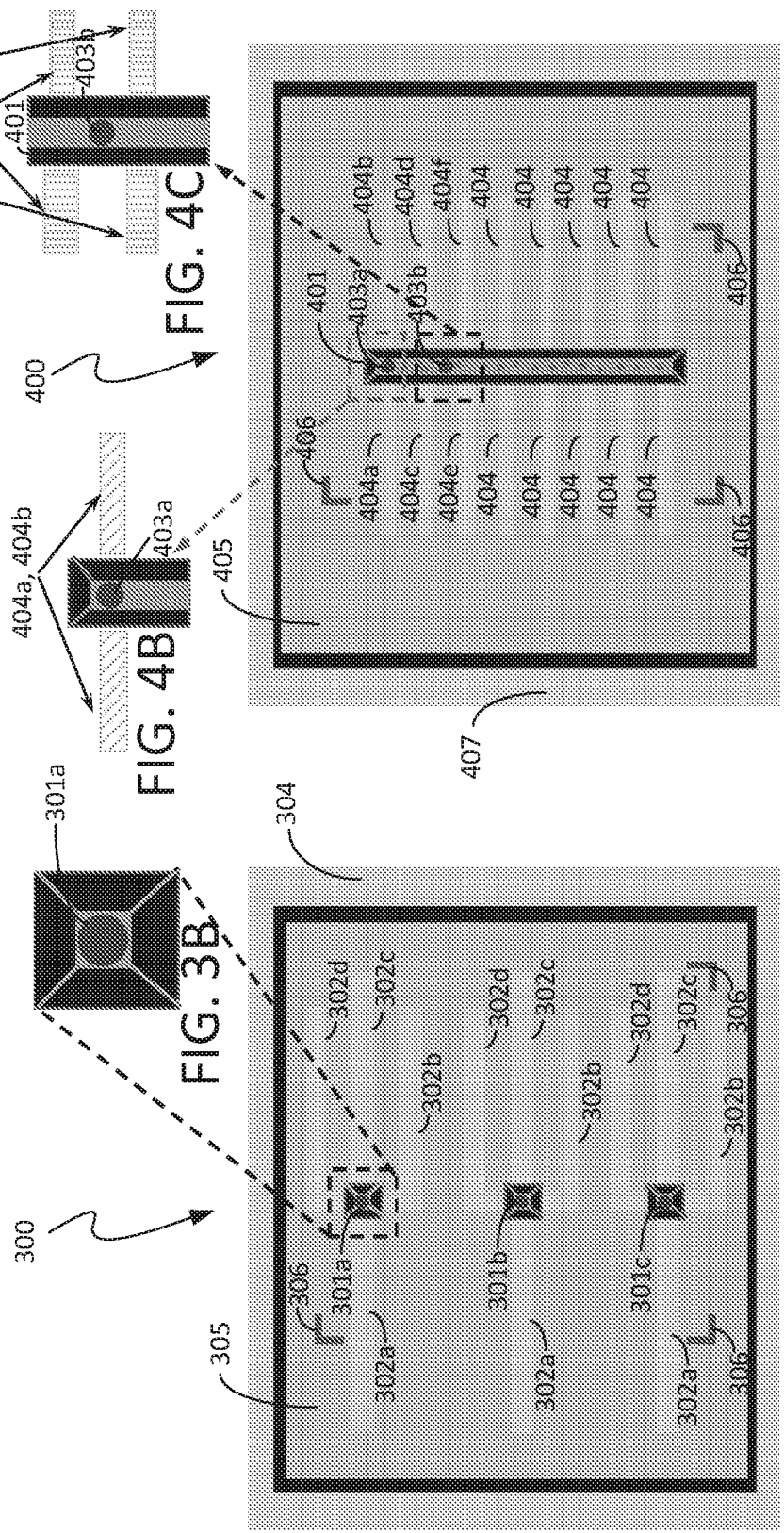

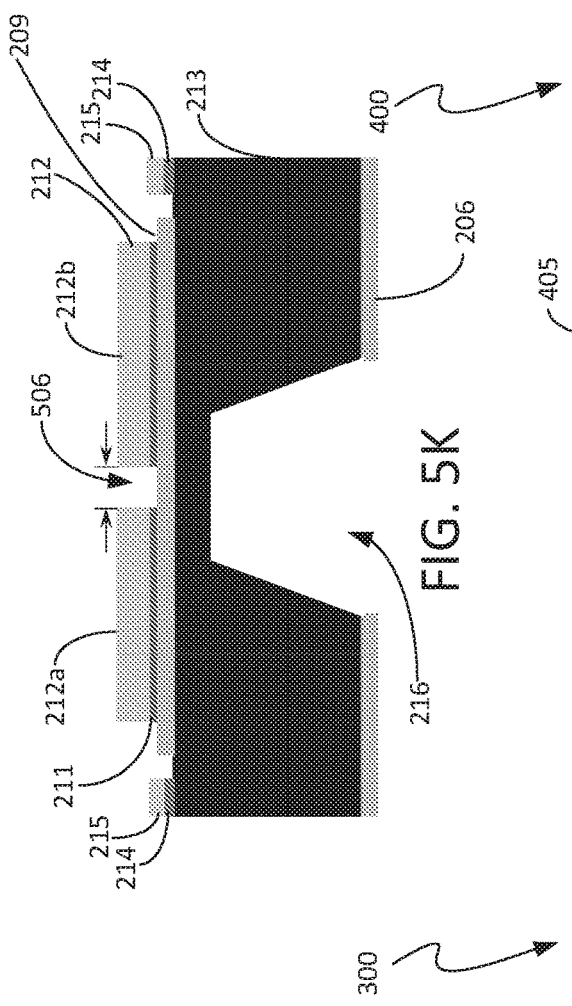
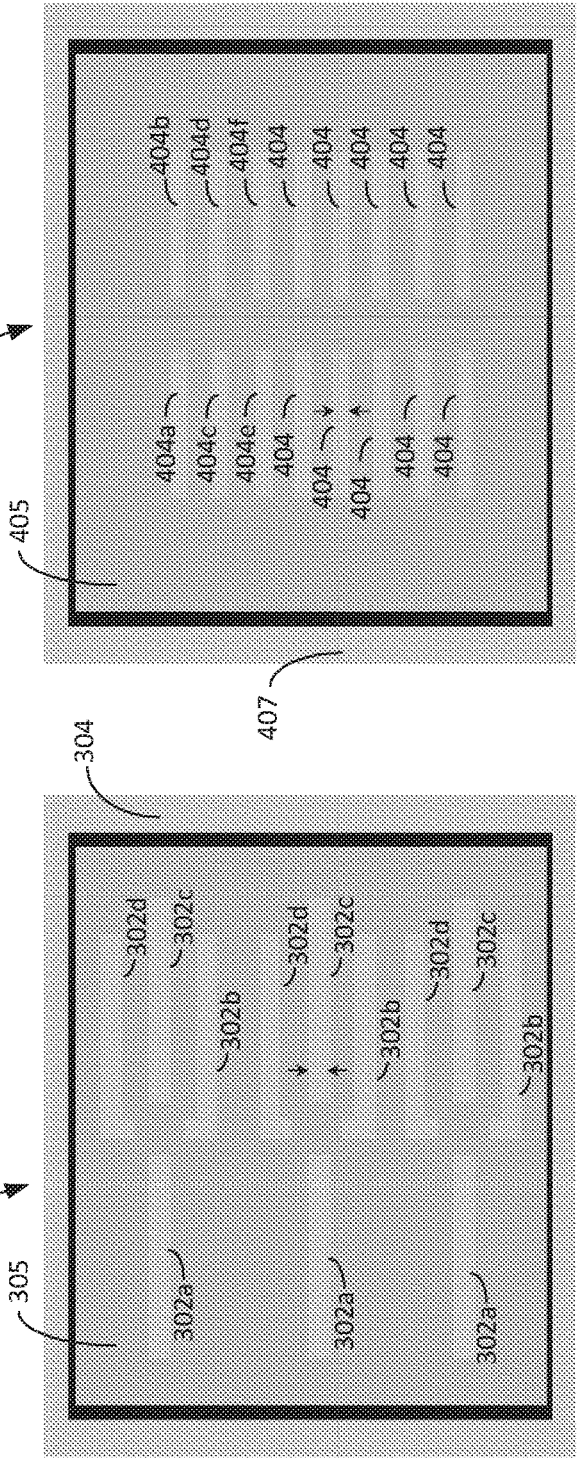
FIG. 5K
FIG. 5L
FIG. 5M

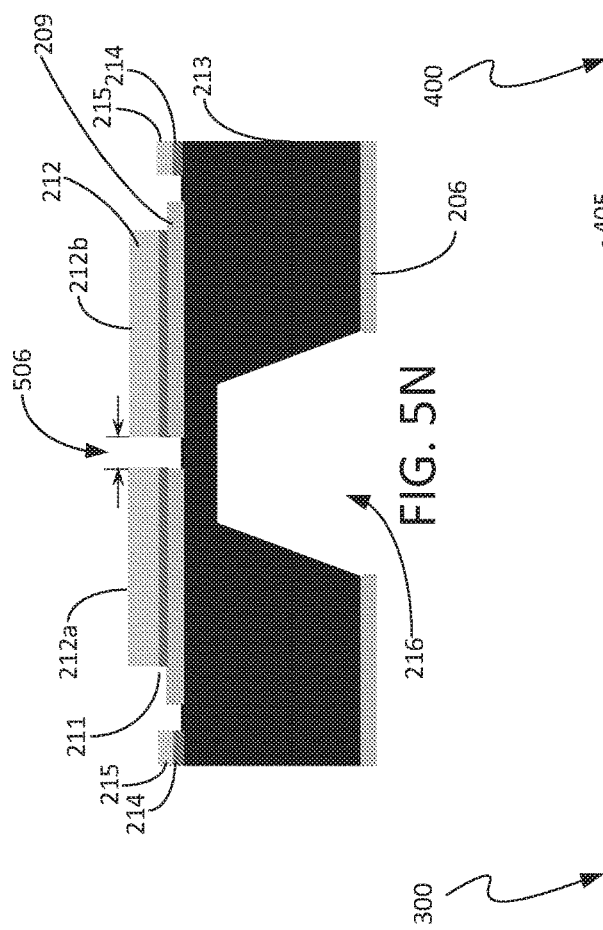
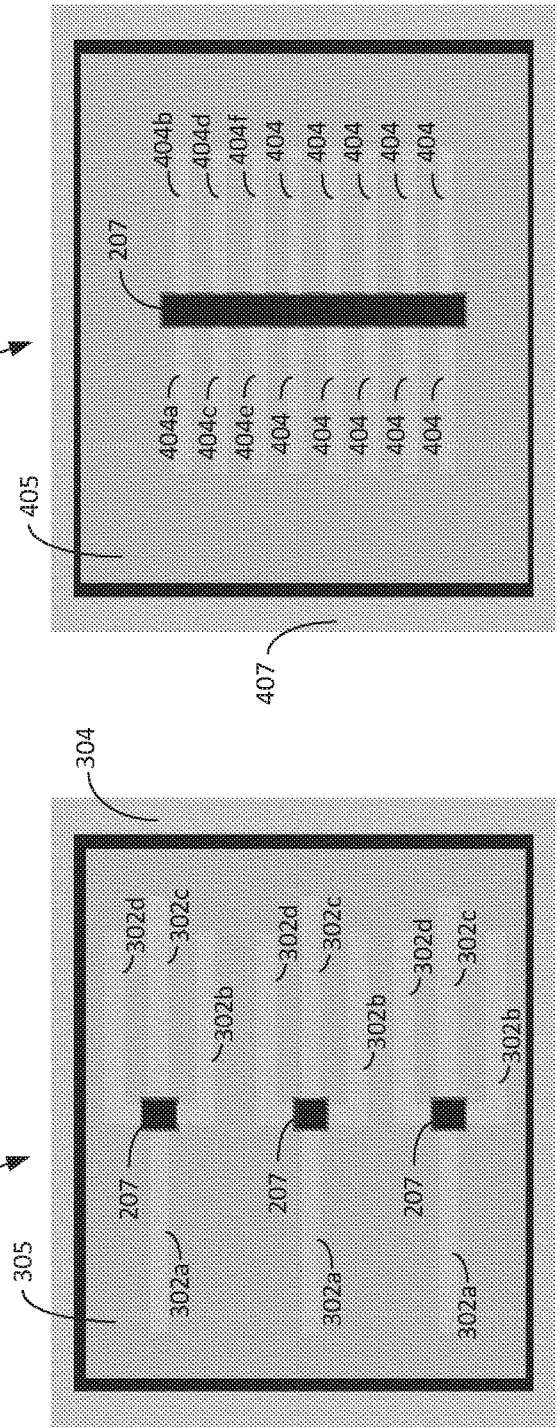
FIG. 5N
FIG. 5O
FIG. 5P

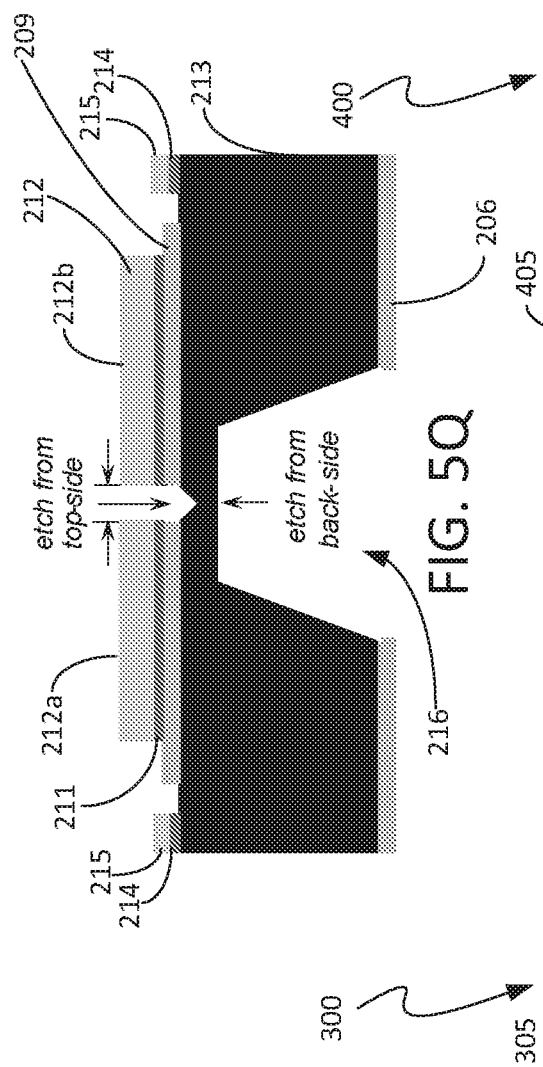
FIG. 5Q
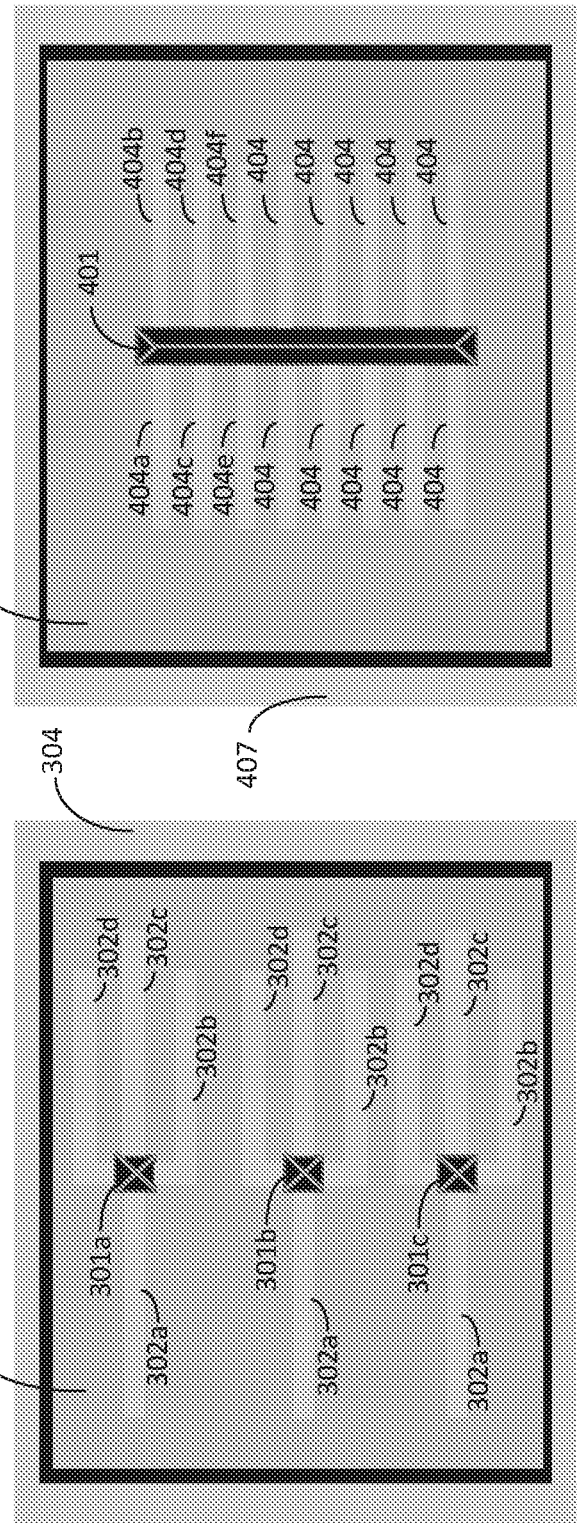
FIG. 5R
FIG. 5S

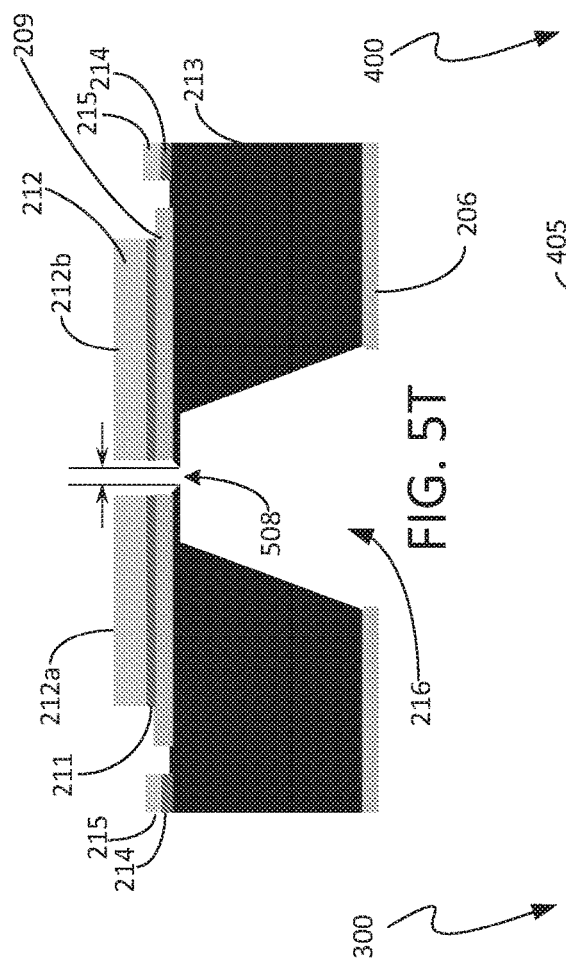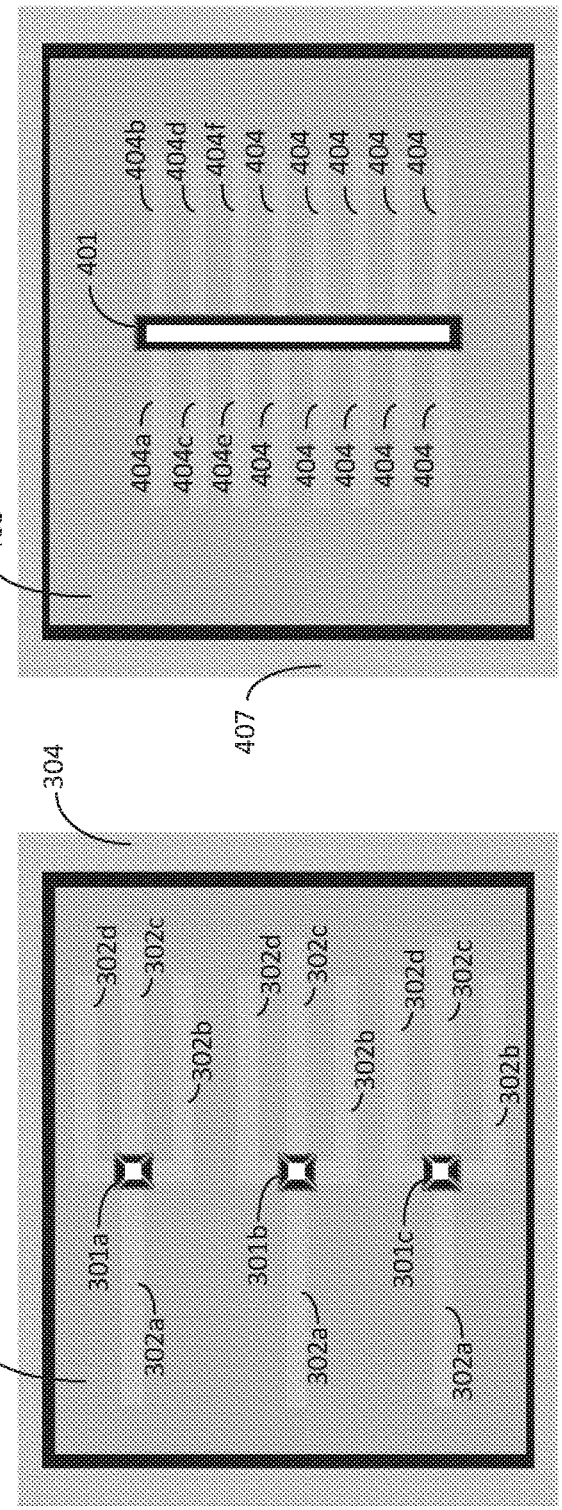

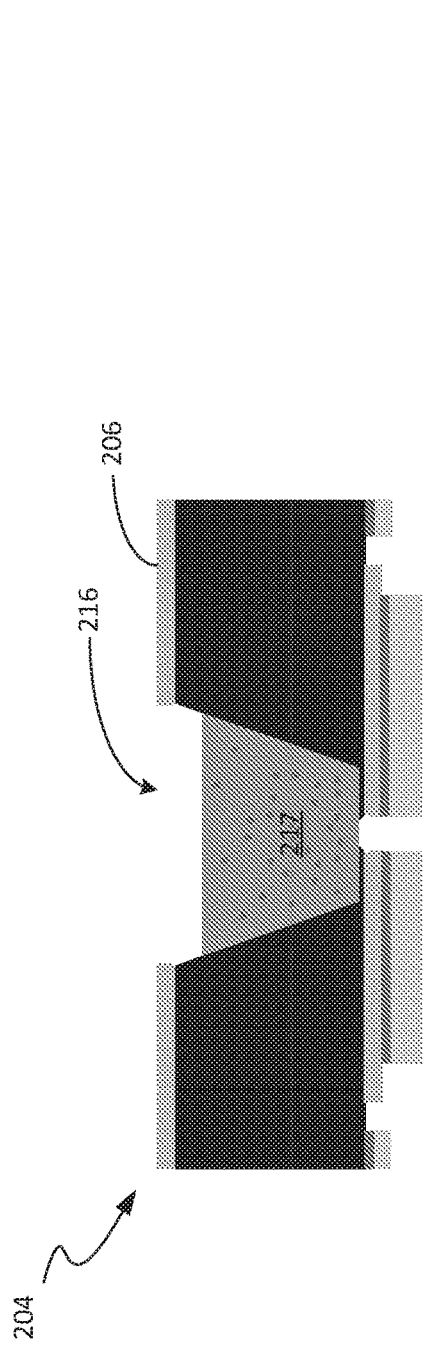
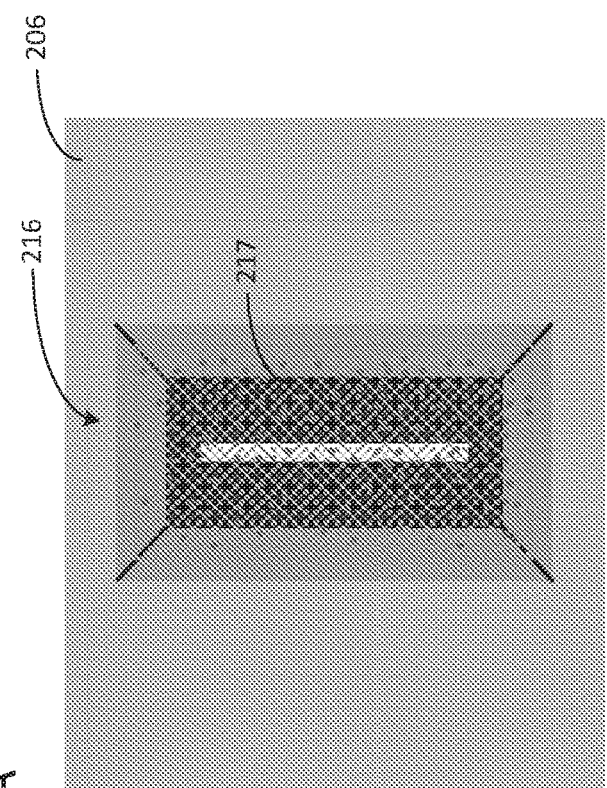
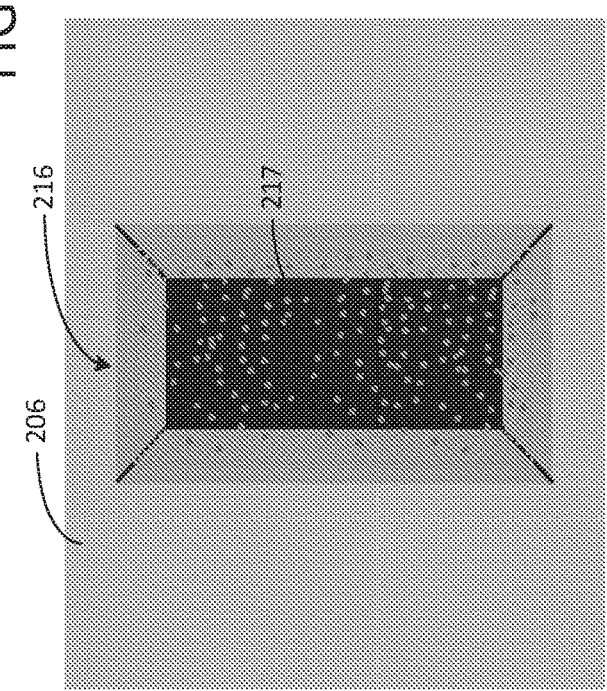
FIG. 7A
FIG. 7B
FIG. 7C

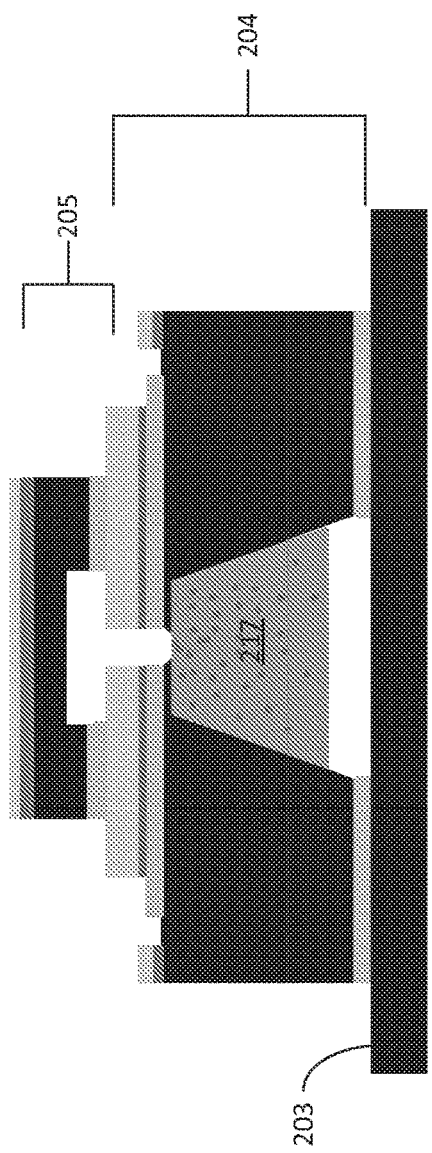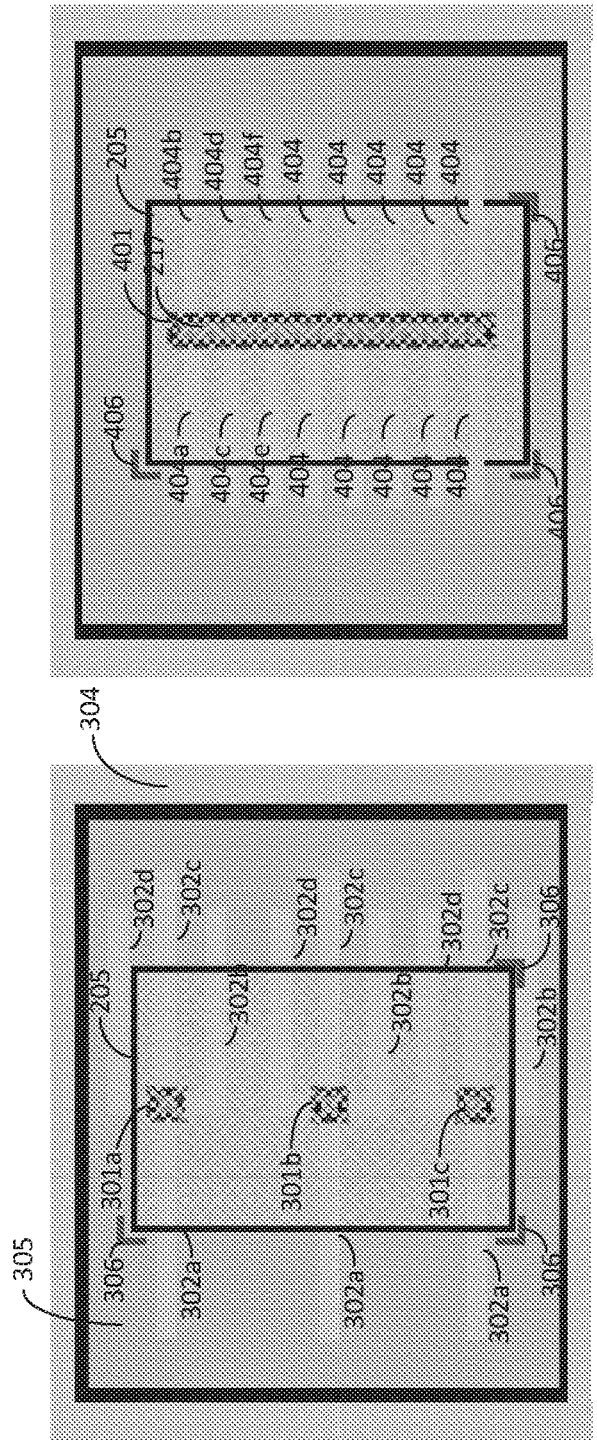

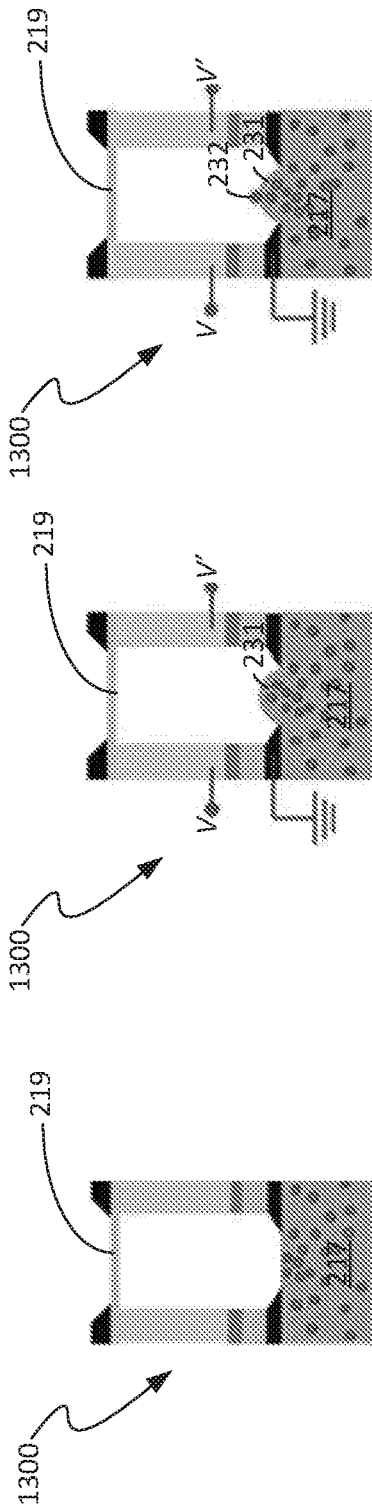
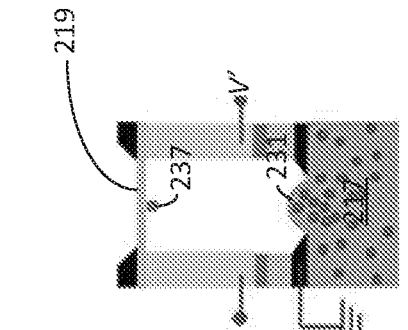
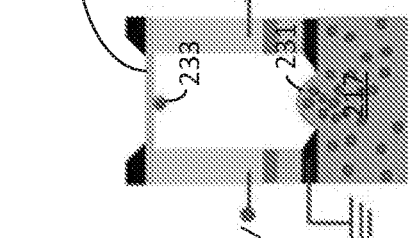
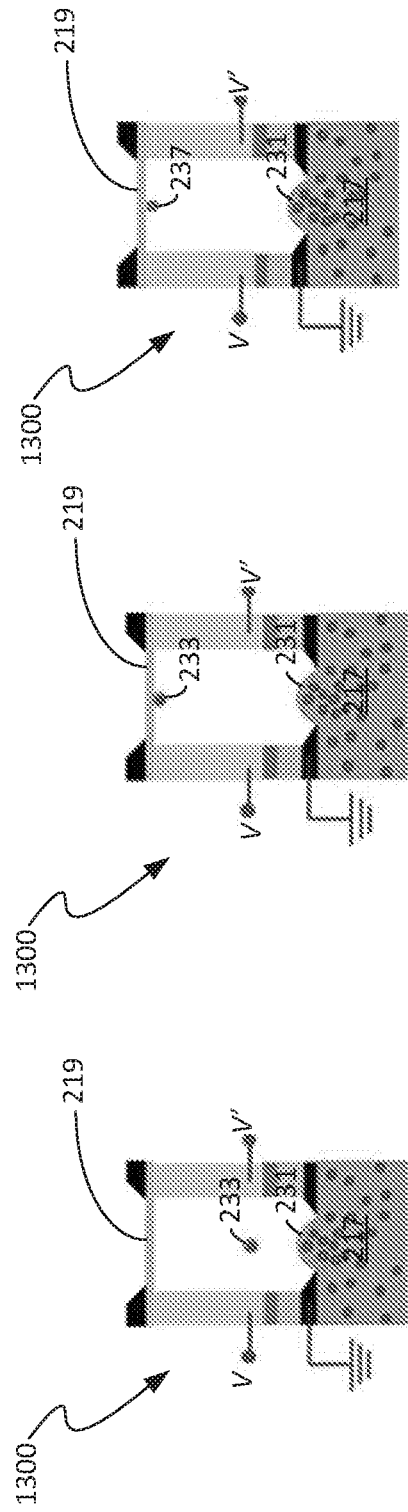
FIG. 14A  FIG. 14B  FIG. 14C
FIG. 14D  FIG. 14E  FIG. 14F

ATOMIC-TO-NANOSCALE MATTER EMISSION / FLOW REGULATION DEVICE

CROSS-REFERENCE TO RELATED APPLICATIONS

This application is a national stage entry pursuant to 35 U.S.C. § 371 of Patent Cooperation Treaty (PCT) international application No. PCT/US2020/031373, filed on May 4, 2020, which claims priority to, and the benefit of the filing date of, U.S. provisional application Nos. 62/842,259 and 62/846,892, filed on May 2, 2019 and May 13, 2019, respectively, entitled "ATOMIC-TO-NANOSCALE MATTER EMISSION/FLOW REGULATION DEVICE respectively, all of which are incorporated herein by reference in their entireties.

STATEMENT OF GOVERNMENTAL INTEREST

The present invention was made under NSF Career Award No. 1661038 awarded by the National Science Foundation. The government has certain rights in this invention.

TECHNICAL FIELD

The present disclosure relates to a nozzle that is capable of emitting matter of sizes ranging from atomic to nanoscale, and systems and methods that incorporate and use the nozzle, respectively.

BACKGROUND

Nozzles and systems that are configured to control the transport of matter under electric control and to thereby, support 3D etching, forming and printing processes approaching the atomic-to-nanoscale generally have high-voltage requirements and are complex and expensive to build, due in part to additional structure needed to direct or align the transport of matter through the nozzles. The nozzles used in the known systems are typically square or circular in cross-sectional shape and are limited in terms of their size, shape and resolution for matter ejection/transport, which determines their pixel size. Additionally, the processes that are used to manufacture the nozzles are not easily scalable.

Alternatives to known nozzle-based systems for 3D etching, forming and printing processes, such as, for example, e-beam lithography, photolithography, metal deposition, etc., are required to be performed in clean rooms, which increases system cost and complexity.

A need exists for a matter emission/flow regulation device that is capable of forming smaller structures than existing nozzle-based and non-nozzle-based system with greater flexibility than existing systems and processes in terms of pixels size, shape and printing resolution. A need also exists for a matter emission/flow regulation system and process that do not require a clean room or high-voltage conditions and that are less complex and less expensive than existing systems and processes.

SUMMARY

In accordance with inventive principles and concepts of the present disclosure, examples are set forth of emission/flow regulation systems, devices and methods for emission/flow regulation of matter ranging in size from atomic to nanoscale, as well as examples of methods for fabricating the systems and devices.

In accordance with an embodiment, the atomic-to-nanoscale matter emission/flow regulation device comprises at least a first nanodroplet generation/control device having a front side, a back side and a first reservoir disposed in between the front side and the back side for holding matter to be extracted. The first nanodroplet generation/control device comprising at least a first nanodroplet column system comprises an upper portion of the first reservoir, a first electrostatic lens (e-lens) disposed in between the upper portion of the first reservoir and the front side of the first nanodroplet generation/control device, and a first nozzle disposed in between the first e-lens and the upper portion of the first reservoir and separated from the first e-lens by a first e-lens-to-filament gap. The first e-lens includes at least a first set of at least first and second electrodes that are laterally separated from one another by a first lateral gap having a gap width. The first nozzle has a first nanodroplet orifice through which nanodroplets generated from matter held in the first reservoir are extracted out of the first reservoir through the first nanodroplet orifice when a first set of preselected voltage signals are applied to the first set of at least first and second electrodes. The first nozzle is precisely aligned with the first lateral gap and has a first nozzle width equal to a distance between innermost edges of side walls of the first nozzle. The first nozzle and the first lateral gap have a common central axis that ensures that the nanodroplets extracted through the first nanodroplet orifice self-align with the first lateral gap. The first nozzle width is less than or equal to 300 nanometers.

In accordance with an embodiment, the method of fabricating the atomic-to-nanoscale matter emission/flow regulation device comprising the following steps:

in a first substrate comprising a first semiconductor material, forming at least a first reservoir that extends in between a front side of the first substrate and a back side of the first substrate for holding matter to be extracted;

forming one or more first layers of insulation on the front side of the first substrate having a thickness equal to a length of a first e-lens-to-filament gap;

forming one or more first patterned metal layers on a top surface of the one or more first layers of insulation having at least a first gap, or opening, therein that extends through said one or more first metal layers and has a first gap width, where opposite sides of the one or more metal layers that define the first gap comprise first and second electrodes of a first e-lens of the atomic-to-nanoscale matter emission/flow regulation device;

using the one or more first patterned metal layers having the first gap therein as a mask during an etching process to etch at least a second gap in the one or more first layers of insulation, where the second gap extends through the one or more layers of insulation and having a width equal to the gap width and is laterally aligned with the first gap; and using the one or more first metal layers and the one or more first layers of insulation having the first and second gaps therein, respectively, as a mask during an etching process to etch a nozzle in the front side of the first substrate that extends into the first reservoir and that has an inlet side disposed inside of the first reservoir and an exit side disposed in the second gap. The etched nozzle has a nozzle width equal to a distance between innermost edges of side walls of the first nozzle, the nozzle width can be less than or equal to 500 nanometers. The nozzle and the first and second gaps have a common central axis. The one or more layers of insulation separate the nozzle from the e-lens by a distance equal to the length of the e-lens-to-filament gap.

In accordance with an embodiment, a method for printing metal structures on a printable substrate is provided comprising the steps of:

providing a first nanodroplet printer comprising at least a first nanodroplet column system comprising an upper portion of a first reservoir, a first e-lens, a first nozzle having a first nozzle width, and a first layer of insulation material disposed in between the first e-lens and the first nozzle and separating the first e-lens from the first nozzle by a first e-lens-to-filament gap; the first reservoir has matter therein to be extracted; the first nozzle has an inlet side disposed in the upper portion of the first reservoir and an exit side disposed in the first e-lens-to-filament gap; the exit side of the first nozzle has side walls that extend away from a common central axis of the first nozzle and the first e-lens; centers of the first nozzle and the first e-lens are precisely aligned along the common central axis such that there is zero misalignment between the centers of the first nozzle and the first e-lens; the first e-lens includes at least a first set of at least first and second electrodes that are laterally separated from one another by a first lateral gap having a first gap width; the printable substrate is mounted on a front side of the first nanodroplet printer in alignment with the first nanodroplet printer; and applying a first set of voltage signals to the first set of at least first and second electrodes to cause a nanodroplet to be generated and extracted through a nanodroplet orifice of the first nozzle; the extracted nanodroplet self-aligns to the e-lens due to the first nozzle and the first e-lens being precisely aligned along the common central axis; the e-lens directs the extracted nanodroplet onto the printable substrate to thereby write a structure on the printable substrate.

These and other features and advantages will become apparent from the following description, drawings and claims.

BRIEF DESCRIPTION OF THE DRAWINGS

FIG. 2A is a cross-sectional view of the atomic-to-nanoscale matter emission/flow regulation device in accordance with a representative embodiment in which the device is a SNAP-Chip printer system.

FIG. 2B is an enlarged cross-sectional view of a portion of the view shown in FIG. 2A that is inside of the dashed box 201, which is a nanodroplet column system.

FIG. 3A illustrates a top view of the atomic-to-nanoscale matter emission/flow regulation device in accordance with a representative embodiment in which the nanodroplet generation/control chip of the device comprises an array of single-filament nozzles.

FIG. 3B is an enlarged top view of one of the single-filament nozzles shown in FIG. 3A.

FIG. 4A illustrates a top view of the atomic-to-nanoscale matter emission/flow regulation device in accordance with a representative embodiment in which the nanodroplet generation/control chip of the device comprises a single multi-filament nozzle.

FIGS. 7A-7J represent the process of assembling a carrier substrate with the nanodroplet generation/control chip of the atomic-to-nanoscale matter emission/flow regulation device and of assembling the nanodroplet generation/control chip with the target substrate structure in accordance with a representative embodiment.

FIGS. 14A-14F are cross-sectional views of the column system shown in FIG. 13 during various stages of a direct writing mode of operations during which structures are additively printed on a target substrate.

DETAILED DESCRIPTION

Figure 1B:
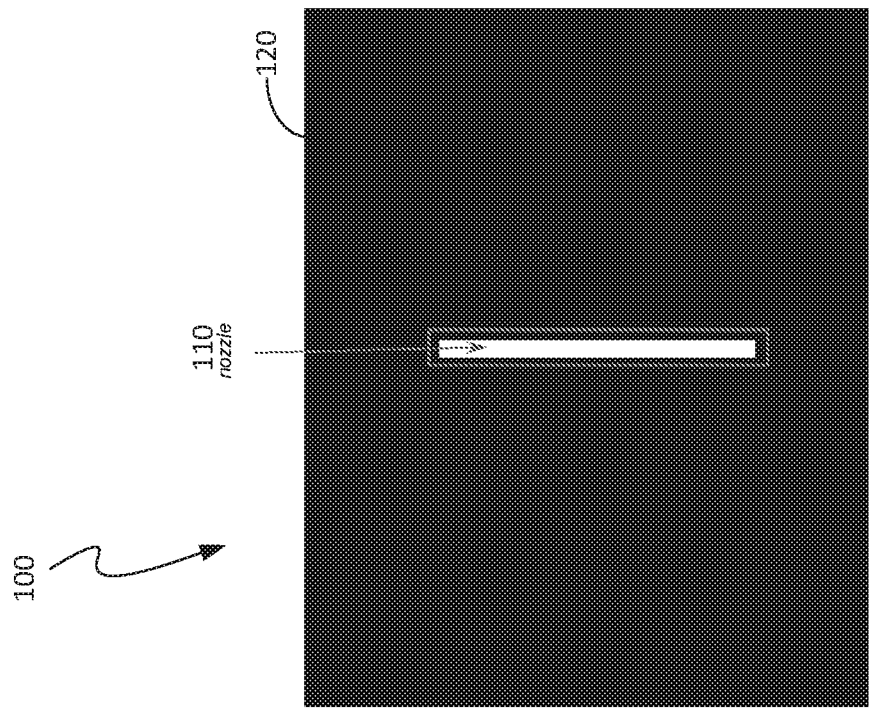
FIGS. 1A and 1B are side and top views, respectively, of an atomic-to-nanoscale matter emission/flow regulation device in accordance with a representative embodiment.

The present disclosure discloses devices, systems and methods that are capable of performing a number of functions, such as, for example, etching, mixing, or printing extremely small metallic structures. For example, printing in the deep- or few-nanometer regime on a variety of substrates such as, for example, silicon chips, paper, flexible polymers, etc., using an electrohydrodynamic printer in the nano-dripping mode can be achieved in accordance with inventive principles and concepts disclosed herein. Printing on this scale can be achieved with a variety of printers, including an all-on-a-chip printer or A Scanning Nano-droplet Additive Printer-on-a-Chip (SNAP-Chip) printer, exemplary embodiments of which are disclosed herein.

The exemplary SNAP-Chip printer can be integrally formed with a fluidic reservoir configured to be filled with a solvent suspension containing metallic nanoparticles. The base of the reservoir can terminate in a nanoscopic orifice of a suitable width depending on the application, such as a few to 1000 nm width in some examples. When a sufficiently large electric stress is applied at the orifice to overcome the surface tension forces at the fluid-air interface, a nanodroplet is extracted.

The trajectory of the nanodroplets can be controlled in-flight using an e-lens in X- and Y-directions to cause the droplet to be delivered to precise locations on a bottom substrate that is located beneath the droplet orifice. Thus, the exemplary SNAP-Chip printer performs nanodroplet generation, extraction, manipulation, and employs a delivery column with functional components that are analogous to the electron column in an electron microscope.

In some embodiments, the nanodroplet comprises a solvent. Upon delivery at a bottom or target substrate, the solvent in the nanodroplet evaporates and leaves behind metal nanoparticle agglomerates with a lateral size equal to that of the droplet diameter. By successive extraction and manipulation of nanodroplets, the exemplary SNAP-Chip printer can print few-nanometer-sized metallic structures in 3D and in an additive fashion using a layer-by-layer approach. Furthermore, arrays of such SNAP-Chip printers can be defined and independently controlled on a silicon chip using IC nanomachining techniques in order to realize a scalable nanoprinting solution.

The exemplary SNAP-Chip printer addresses a currently un-met technological need involving an ability to print few-nanometer-sized metallic structures in 3D using a scalable (i.e., manufacturable via semiconductor fabrication processes) process and printer. The SNAP-Chip printer, additive printer, has the ability to meet the nanomanufacturing needs of multiple industries: integrated circuits (IC), touch screens/mobile electronics, flexible electronics, currency printing, biomolecular patterning, nanophotonics, and micro-electromechanical/nano-electromechanical systems (MEMS/NEMS). The SNAP-Chip printer can also be a subtractive printer, as will be described below in more detail.

The exemplary SNAP-Chip printer can be configured as an all-on-a-chip electrohydrodynamic (EHD) printer for scalable printing of few-nanometer-sized metallic constructs in 3D and at ultra-low deposition voltages of 10V to 30V without the need for a clean room. The exemplary SNAP-Chip printer can be enabled by a nanodroplet column, which can have functional components that are analogous to the electron column in an electron microscope, if desired. In comparison to the current state-of-the-art, the exemplary SNAP-Chip printer can deliver the following advances: a 10× reduction in minimum printed feature size, a 10× to 50× improvement in deposition voltage, a 10,000× improvement in the number of printers on a single four-inch wafer, and a substantial reduction in system complexity in terms of the underlying droplet nanomanipulation mechanism.

In the following detailed description, for purposes of explanation and not limitation, exemplary, or representative, embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only and is not intended to be limiting. The defined terms are in addition to the technical and scientific meanings of the defined terms as commonly understood and accepted in the technical field of the present teachings.

As used in the specification and appended claims, the terms "a," "an," and "the" include both singular and plural referents, unless the context clearly dictates otherwise. Thus, for example, "a device" includes one device and plural devices.

Relative terms, such as "above," below," "top," "bottom," "front," "back," etc., may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" or "electrically coupled to" another element, it can be directly connected or coupled, or intervening elements may be present.

The term "memory" or "memory device", as those terms are used herein, are intended to denote a non-transitory computer-readable storage medium that is capable of storing computer instructions, or computer code, for execution by one or more processors. References herein to "memory" or "memory device" should be interpreted as one or more memories or memory devices. The memory may, for example, be multiple memories within the same computer system. The memory may also be multiple memories distributed amongst multiple computer systems or computing devices.

A "controller," as that term is used herein, a computational device configured with hardware, software and/or firmware to perform one or more control algorithms disclosed herein. References herein to a controller should be interpreted as one or more controllers. A controller may be, for example, one or more microcontrollers, or one or more microprocessors or processing cores. A controller may also refer to a collection of controllers or processors within a single computer system or distributed amongst multiple computer systems. The term "computer" should also be interpreted as possibly referring to a collection or network of computers or computing devices, each comprising a processor or processors. Instructions of a computer program can be performed by multiple controllers or processors that may be within the same computer or that may be distributed across multiple computers.

The terms "no misalignment," "zero misalignment," or "precise alignment," as used herein mean that alignment is so precise that no measurable misalignment exists, e.g., to the extent that misalignment exists, it cannot be detected using a transmission electron microscope.

Exemplary, or representative, embodiments will now be described with reference to the figures, in which like reference numerals represent like components, elements or features. It should be noted that features, elements or components in the figures are not intended to be drawn to scale, emphasis being placed instead on demonstrating inventive principles and concepts.

Figure 1A:
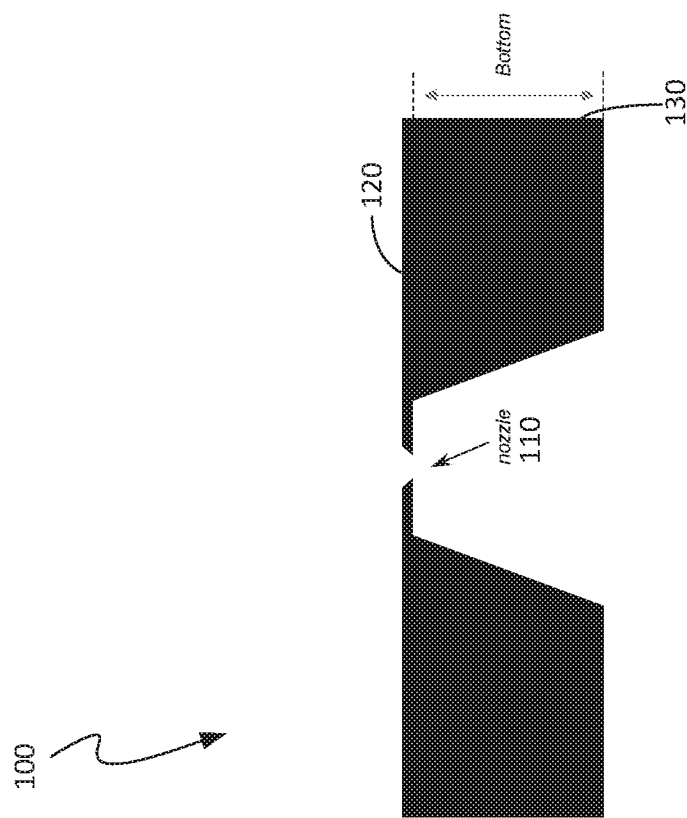

FIGS. 1A and 1B are side and top views, respectively, of the atomic-to-nanoscale matter emission/flow regulation device 100 in accordance with a representative embodiment. In accordance with this embodiment, the device 100 includes one or more nozzles 110, a top layer 120 and a bottom 130. The nozzle(s) 110 can be integrally formed with the top layer 120, as discussed below in further detail. The bottom 130 can also be integrally formed with the top layer 120 or they may be formed separately and then physically coupled with one another. The bottom 130 can be configured, or customized, if desired, for a particular application. The nozzle(s) 110 can be used as a stand-alone device for certain applications.

FIG. 2A is a cross-sectional view of the atomic-to-nanoscale matter emission/flow regulation device 200 mechanically coupled to a target substrate structure 205 in accordance with a representative embodiment in which the device 200 is a SNAP-Chip printer system. FIG. 2B is an enlarged cross-sectional view of a portion of the view shown in FIG. 2A that is inside of the dashed box 201, which is the nanodroplet column system of the device 200. The nozzle 202 can be, for example, incorporated into the SNAP-Chip printer system 200 as shown in FIG. 2A or it can be incorporated into the nanodroplet column system 201 as shown in FIG. 2B. The nozzle 202 can have the same shape as the nozzle 120 shown in FIG. 1B. The SNAP Chip printer system 200 comprises a carrier substrate 203, a nanodroplet generation/control chip 204 disposed on the carrier substrate 203, and the target substrate structure 205 disposed on the nanodroplet generation/control chip 204. A layer of insulation 206 is disposed in between a bottom 207 of the nanodroplet generation/control chip 204 and a top surface of the carrier substrate 203.

A top layer or surface 208 of a chip substrate 213 of the nanodroplet generation/control chip 204 has a layer of insulation 209 and an adhesion layer 211 disposed thereon. The chip substrate 213 may comprise, for example, highly-doped (conductive) silicon, although any suitable material may be used for the chip substrate 210. The adhesion layer 211 has a metallization layer 212 disposed on it. The top layer 208 also has an adhesion layer 209 disposed on it on which another metallization layer 215 is disposed. A reservoir 216 is defined by a cavity formed in the bottom 207. The reservoir 216 holds liquid, gas, or solid-plus-liquid phase matter 217, which, for ease of discussion, is referred to herein as "matter".

A layer of insulation 218 is disposed in between the metallization layer 212 and a bottom surface of a target substrate 219 of the target substrate structure 205. A top surface of the etchable substrate 219 has an adhesion layer 221 disposed thereon, on top of which is a metallization layer 222 of the target substrate structure 205. The layers of insulation 206, 209 and 218 may be, for example, silicon nitride ($Si_3N_4$). The carrier substrate 203, chip substrate 213 and target substrate 219 may be, for example, silicon (Si).

With reference to FIG. 2B, the nanodroplet column system 201 includes the nozzle 202, the e-lens 225 and the e-lens-to-filament gap 226. The matter 217 forms a meniscus or filament 231 at the nozzle 202 and a pendant droplet 232 forms at the top of the filament 231. The next pendant droplet 232 is extracted from the filament 231 and becomes the extracted droplet 233. The extracted droplet 233 is printed on the bottom surface 219a of the target substrate 219 to become the printed structure 237. The target substrate structure 205 having the printed structure 237 thereon can be decoupled from the device 200 after completion of the printing process.

The process that can be used to fabricate the device 200 is described below in detail, but in general, a semiconductor fabrication process can be used to fabricate the device 200.

Nozzles and systems designed in accordance with the inventive principles and concepts disclosed herein can include dynamically reconfigurable, multi-filament nozzle designs for on-demand, location-controlled nanodroplet extraction. For example, the exemplary SNAP-Chip printer system 200 shown in FIG. 2A enables printing of linear patterns without any nozzle and/or substrate movement required to print the linear patterns.

Furthermore, in accordance with the inventive principles and concepts disclosed herein, "self-aligned" or "self-focusing" nanodroplet filaments can be formed, which eliminates droplet absorption at the e-lens 225 and obviates the need for additional downstream droplet focusers or homogenizers. Additionally, designs constructed in accordance with the inventive principles and concepts disclosed herein eliminate the need to include components to facilitate back-pressure or flow required by known systems to create the droplet filament 231 at the nozzle tip 202. Therefore, designs constructed in accordance with the inventive principles and concepts disclosed herein are less complex than the known structures because they eliminate the need for components to deliver back-pressure or flow. Moreover, in accordance with the inventive principles and concepts disclosed herein, exemplary geometries are disclosed that eliminate lateral deformation of the meniscus or filament 231, which, if not eliminated, result in fluid wetting of the sidewalls of the e-lens 225. As will be discussed below in more detail, this feature is achieved, at least in part, through suitable optimization of the surface-to-volume ratios at the deforming meniscus 231 prior to evolution of the pendant droplet 232.

Additionally, in accordance with inventive principles and concepts disclosed herein, smaller diameters for the nozzle 202, below a characteristic threshold, are utilized to obviate the need for wettability tuning of silicon/nitride sidewalls, thereby obviating the need to perform additional surface coating steps to achieve wettability tuning. This is achieved, at least in part, by reducing the size of the nozzle 202 to increase the dominance of surface tension effects, thereby preventing the deforming meniscus from spreading on downstream sidewalls of the silicon nitride 209 of the column 201.

In the exemplary embodiment of FIG. 2B, the e-lens 225 can be formed using a chromium/gold (Cr/Au) stack (metallization layer 212) in any suitable range, such as, for example, 40 nm to 215 nm. It should be noted, however, that the e-lens 225 is not limited with respect to the materials it is made or the thickness of the metallization layer 212. As will be understood by those of skill in view of the description provided herein, a variety of suitable materials can be used to construct the e-lens 225 and the thickness of the e-lens 225 can vary depending on a number of factors. The portions of the metallization layer 212 disposed on opposite sides of the e-lens 225 correspond to first and second electrodes for applying a first voltage potential, V, to the e-lens 225. In this embodiment, the metallization layer 222 of the target substrate structure 205 is an electrode to which a second voltage potential, V', is applied. In this embodiment, the metallization layer 215 is at ground potential. A processor or controller (not shown) can be electrically coupled to the electrodes formed by metallization layers 212 and 222 for selectively controlling the voltage potentials V and V' that are applied to the metallization layers 212 and 222, respectively.

A suitable printed target structure 237, such as a 2 nm to 2 µm structure shown in the exemplary embodiment of FIGS. 2A and 2B, or any other suitable target structure for any particular application, can be provided as a target for the nanodroplets. In order to achieve self-aligned droplets, the e-lens-to-filament gap 226 can be formed using suitable structures, such as, for example, a 30-to-200 nm-thick layer 209 of silicon nitride plus a 15 nm-to-2 µm-thick layer 208 of Si in the column 201 shown in FIG. 2B. The column 201 having the nozzle 202 with a suitable opening formed therethrough with a width of 20 nm to 2 µm in this representative embodiment provides a suitable structure for depositing self-aligned nanodroplets on the target substrate 219.

It should be noted that the materials other than silicon nitride and silicon can be used for layers 209 and 208, respectively, and that the inventive principles and concepts are not limited to these layers having any particular thicknesses or range of thicknesses. The materials that are used and the layer thicknesses will depend on a number of factors, such as, for example, the matter 217 that is being used to form the droplets and the dimensions of the structure 237 to be formed on the target substrate 219.

FIG. 3A is a top view of a nanodroplet generation/control chip 300 of an atomic-to-nanoscale matter emission/flow regulation device in accordance with a representative embodiment in which the chip 300 includes a m-by-N array of single-filament nozzles 301a-301c, where N is a positive integer that is greater than or equal to 2 and M is a positive integer that is greater than or equal to 1. FIG. 3B is an enlarged top view of the single-filament nozzle 301a shown in FIG. 3A. In the exemplary configuration shown in FIG. 3A, M=1 and N=3. In accordance with this representative embodiment, each single-filament nozzle 301a-301c is connected to four electrodes 302a-302d. Each of the nozzles 301a-301c can have a nanodroplet column configuration (not shown) that is similar to the configuration of the nanodroplet column 201 shown in FIG. 2B. However, the nozzles 301a-301d shown in FIGS. 3A and 3B are square in shape whereas the nozzle 201 has the shape of the nozzle 120 shown in FIG. 1B, and the e-lens 225 shown in FIG. 2B has two electrodes disposed on opposite sides of the column 201 whereas the e-lens of each column of each of the nozzles 301a-301c shown in FIG. 3A has four electrodes 302a-302d arranged symmetrically about the respective nozzle 301a-301c. Each of the nozzles 301a-301c has a hemispherical meniscus.

A processor or controller (not shown) can be electrically coupled to the electrodes 302a-302d for selectively controlling the voltage potentials that are applied to the electrodes 302a-302d. In this way, the nozzles 301a-301c are dynamically reconfigurable to provide on-demand, location-controlled nanodroplet extraction. This feature allows greater flexibility in the structures that are formed on the target substrate (not shown).

In accordance with this representative embodiment, the layer of insulation 305, which may be silicon nitride or some other suitable electrical insulator material, is disposed on top of a metallization layer 304 and has three precisely placed alignment fiducials or markers 306 on it that can be used by a known machine vision/pick and place system (not shown) to align the target substrate structure (not shown) with the nanodroplet generation/control chip 300 during assembly of the atomic-to-nanoscale matter emission/flow regulation device.

FIG. 4A is a top view of a nanodroplet generation/control chip 400 of an atomic-to-nanoscale matter emission/flow regulation device in accordance with a representative embodiment in which the chip 400 includes a single multi-filament nozzle 401 configured to extract multiple nano-droplets filaments. FIG. 4B is an enlarged top view of a single nanodroplet filament 403a having first and second polarized electrodes 404a and 404b, respectively, disposed on opposite sides thereof. FIG. 4C is an enlarged top view of a single nanodroplet filament 403b having first and second pairs of polarized electrodes 404c, 404d and 404e, 404f, respectively, disposed above and below the filament 403b, respectively, with the electrodes of each pair being disposed on opposite sides of the nozzle 401.

The nozzle 401 can have a nanodroplet column configuration (not shown) that is identical to the configuration of the nanodroplet column 201 shown in FIG. 2B, except that the electrode configurations are different. A processor or controller (not shown) can be electrically coupled to the electrodes 404 for selectively controlling the voltage potentials that are applied to the electrodes 404. In this way, the nozzle 401 is dynamically reconfigurable to provide on-demand, location-controlled extraction of the nanodroplets 403 to provide greater flexibility in placement of the droplets 403 and the structures that are formed on the target substrate (not shown).

In accordance with this representative embodiment, the layer of insulation 405, which may be silicon nitride or some other suitable electrical insulator material, is disposed on top of a metallization layer 407 and has three precisely placed alignment fiducials or markers 406 that can be used by a known machine vision system/pick and place machine (not shown) to align the target substrate structure (not shown) with the nanodroplet generation/control chip 400 during assembly of the atomic-to-nanoscale matter emission/flow regulation device. As illustrated in FIGS. 3A-3B and 4A-4C, structures and systems constructed in accordance with the inventive principles and concepts disclosed herein can include an arrays of single-filament nozzles 301a-301c, as shown in FIG. 3A, or a single multi-filament nozzle 401, as show in FIG. 4A, that can be dynamically reconfigurable, for on-demand, location controlled nanodroplet extraction. The nozzle configurations shown in FIGS. 3A-4C can also be combined in various ways within the same nanodroplet generation/control chip of an atomic-to-nanoscale matter emission/flow regulation device to provide additional flexibility in terms of printing/forming resolution, structure location, structure shape and size, pixel size, etc. One or more of the pairs of electrodes 404 shown in FIGS. 4A-4C can include polarized electrodes for facilitating location controlled, on-demand filament extraction.

The atomic-to-nanoscale matter emission/flow regulation devices described above with reference to FIGS. 1A-4C can achieve a number of potential uses including, but not limited to, on-chip nanolabs for electron/scanning probe microscopy supplies, mechanisms for precise dosing of fluids, down to ~35 yL (1 yoctoliter=$10^{-24}$ liters), projection printing of miniaturized nanostructures with 2-D (in lateral dimensions) control and 3-D shape (in vertical dimensions using stepped height) control, on-demand chemical synthesis of nanostructures, droplet-based nanolithography, etc.

Figure 5A:
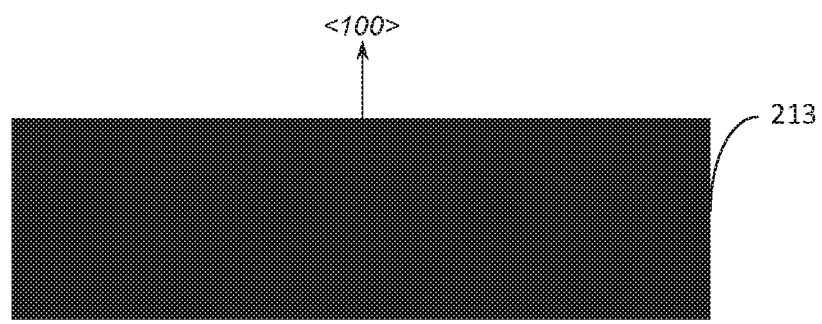
FIGS. 5A-5V illustrate semiconductor process steps that may be used to fabricate the nanodroplet generation/control chips of the atomic-to-nanoscale matter emission/flow regulation device in accordance with a representative embodiment.

Representative embodiments of processes that can be used to fabricate exemplary configurations of the atomic-to-nanoscale matter emission/flow regulation devices and the nanodroplet generation/control chips will now be described with reference to FIGS. 5A-5V and 7A-7J. FIGS. 5A-5V illustrate semiconductor process steps that may be used to fabricate the nanodroplet generation/control chips described above with reference to FIGS. 2A-4C. For ease of explanation, it is assumed that the chip being fabricated is the chip 204 shown in FIG. 2A. Because the steps can be known semiconductor process steps, a detailed discussion of all of the sub-steps involved in each of the steps, such as photolithographic steps of masking, etching, deposition, etc., is omitted in the interest of brevity.

With reference to FIG. 5A, the fabrication process can begin with providing the substrate 213, which can be a double-side polished silicon substrate with ultra-low resistivity. The substrate 213 can be formed of any suitable material(s) and can be of any suitable thickness depending on the application or process. Here, the substrate 213 was chosen to include Si having a thickness ranging between 100 to 500 µm.

Figure 5B:
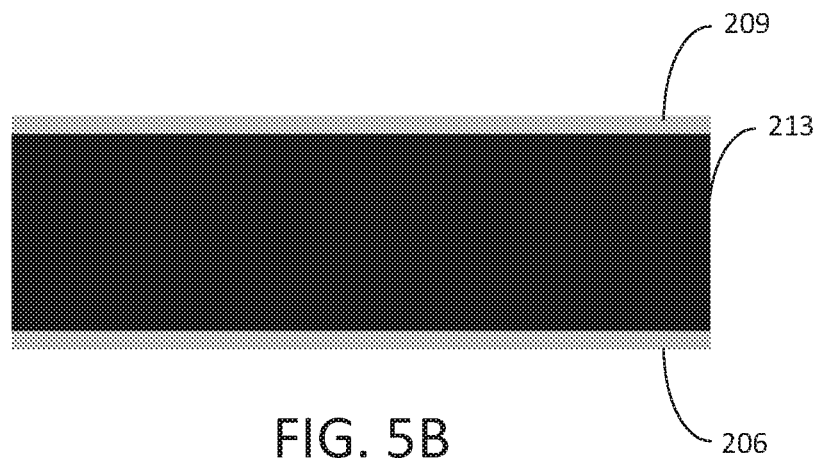

Next, low-stress silicon nitride films 206 and 209 can be deposited on the bottom and top surfaces, respectively, of the substrate 213, as shown in FIG. 5B. Any suitable dielectric film can be selected that provides sufficient tensile stress to prevent membrane buckling after etching, such as, for example, a 30 nm to 200 nm thick silicon nitride film or other suitable material or composition of materials.

Figure 5C:
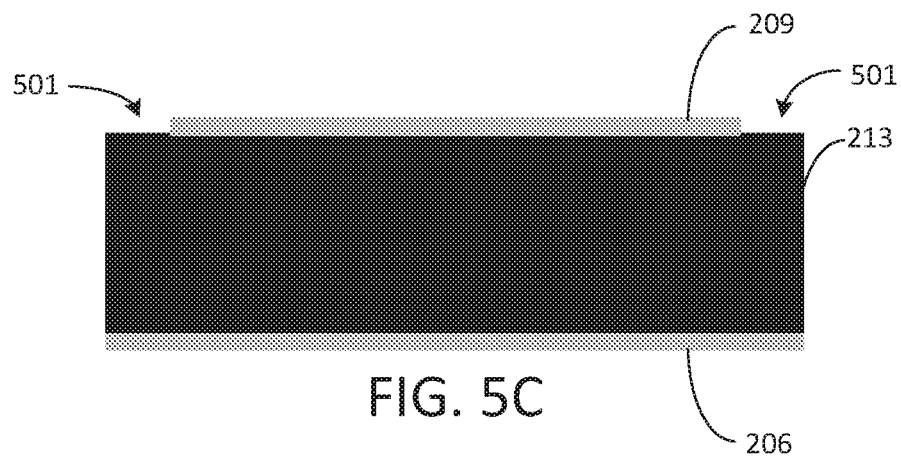
Figure 5D:
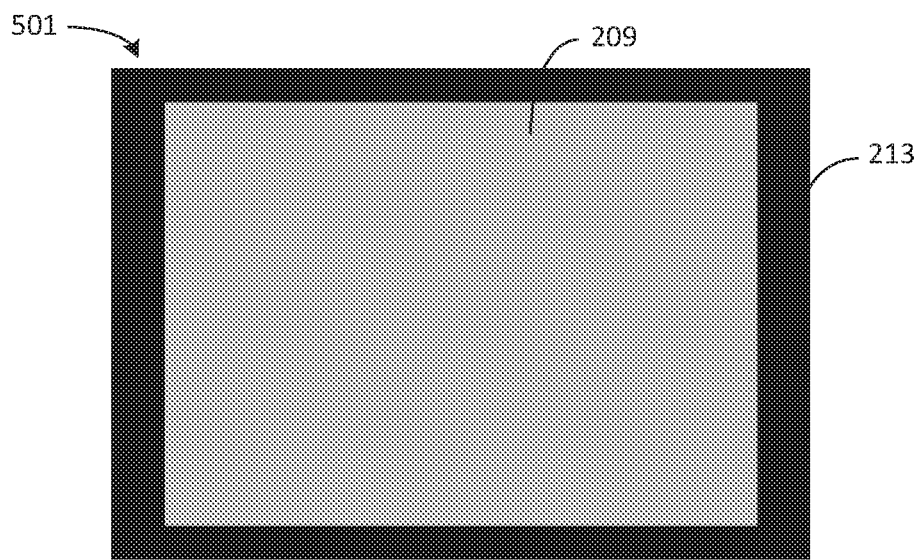

As illustrated in the cross-sectional view of FIG. 5C, one or more windows can be opened within the silicon nitride film 209 at the substrate periphery using photolithography, for example, which can be followed by dry etching, such as reactive ion etching (RIE), for example. FIG. 5D illustrates a top side view of what is shown in FIG. 5C.

Figure 5E:
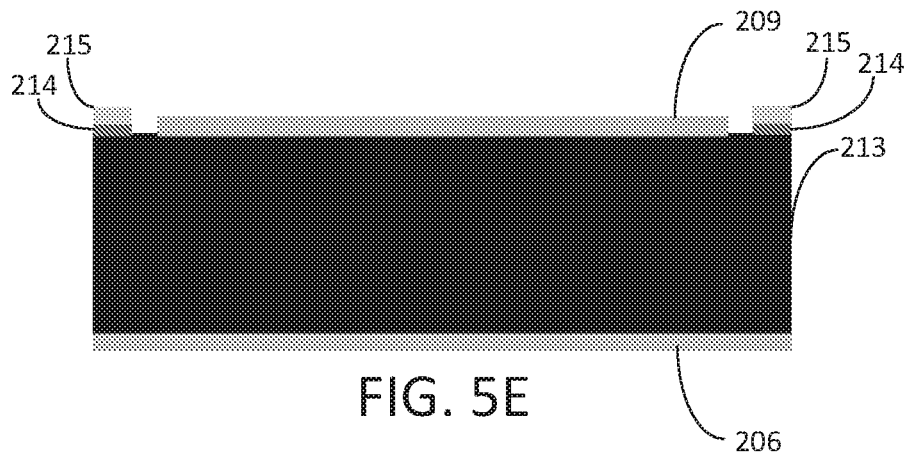
Figure 5F:
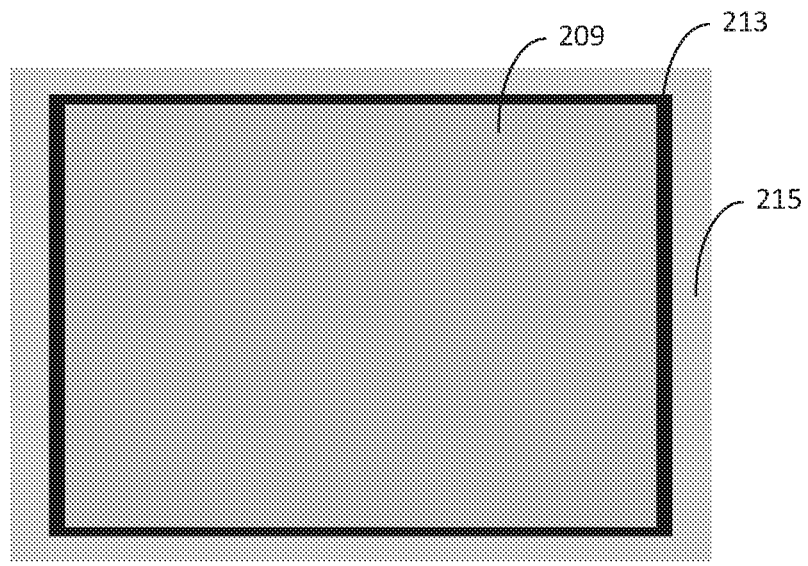

As illustrated in the cross-sectional view shown in FIG. 5E, a patterned adhesion layer 214 is formed on the top surface of the substrate 213 where the windows were opened in the silicon nitride file 209 and an Au or other metal film 215, such as Pt or other suitable metal, can be deposited using a suitable metallization process, such as photolithography followed by metal deposition and lift-off, for example. This creates a conductive connection to the underlying silicon substrate 213 for delivering electrical signals from the top side of the chip 204. The adhesion layer 214 can be formed of any suitable material, such as Cr or other suitable material. FIG. 5F is a top view of the device shown in FIG. 5E.

Figure 5G:
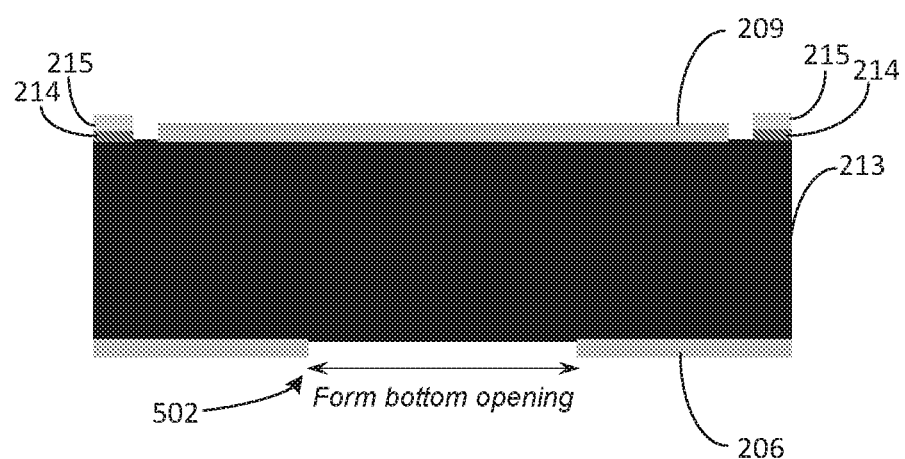
Figure 5H:
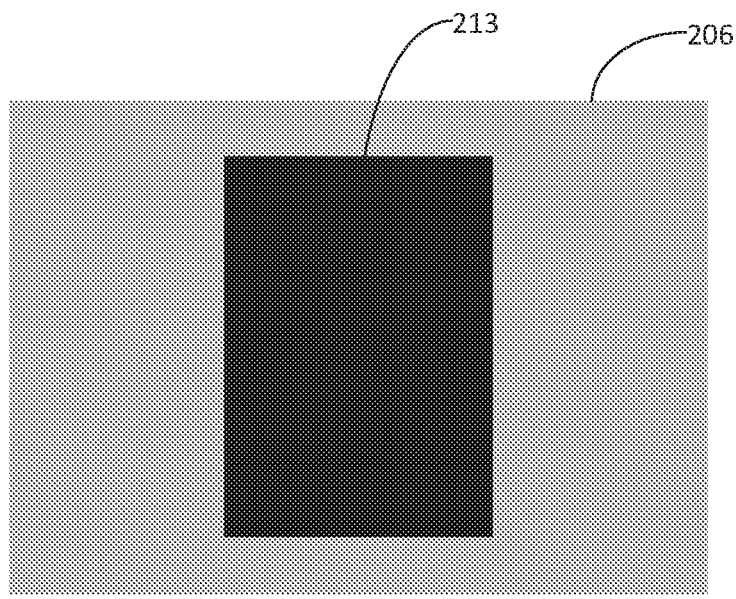

As illustrated in the cross-sectional view of FIG. 5G, a substantially rectangular window 502 can be formed in the silicon nitride layer 206, such as by using photolithography followed by wet etching or by using dry etching (e.g., RIE) or other process. The window 502 can be, for example, 1.5t+50 µm wide, where "t" indicates the thickness of the silicon substrate 213. The width of the window 502 may be, for example, 200 to 600 µm wide. FIG. 5H illustrates the back-side view of the device shown in FIG. 5G.

Figure 5I:
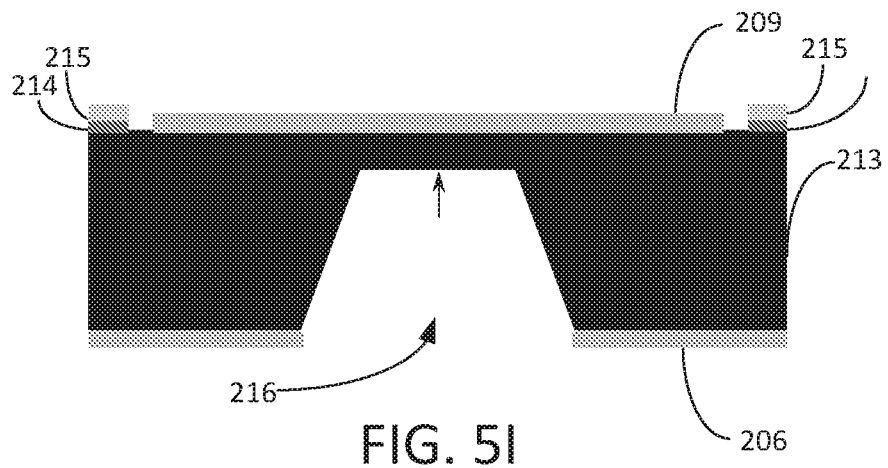
Figure 5J:
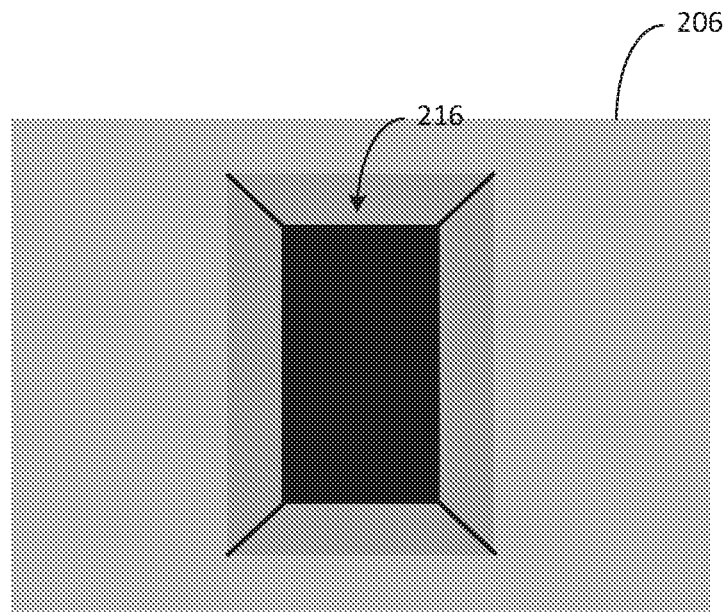

The cross-sectional view of FIG. 5I illustrates the device shown in FIG. 5G after a partial wet etch has been performed on the back side of the silicon substrate 213 using, for example, tetra-methyl ammonium hydroxide (TMAH) or potassium hydroxide (KOH) to form a reservoir 216. Other solutions are contemplated as well. Target thickness for the remaining silicon can vary in certain exemplary embodiments from ~10 µm to ~100 µm in the etched region, for example. FIG. 5J illustrates a back-side view of the device shown in FIG. 5I.

Next, the e-lens electrodes 212a and 212b can be formed in the metallization layer 212 and in the adhesion layer 211 on which the metallization layer 212 is disposed, as shown in the cross-sectional view of FIG. 5K. A combination of photolithography or electron beam lithography, followed by metal deposition and then lift-off, may be used for this purpose. Any suitable process for patterning the adhesion layer 211 and the metallization layer 212 can be used for this purpose. The process steps represented by FIG. 5K forms a gap 506 in the adhesion and metallization layers 211 and 212, respectively.

The adhesion layer 211 can comprise, for example, a ~5 nm-to-15 nm thick layer of Cr or other suitable adhesion material and the metallization layer 212 can comprise, for example, a ~35 nm-to-~200 nm thick layer of Au, tungsten, platinum, or other suitable metal. The electrodes 212a and 212b, the adhesion layer 211 and the gap 506 comprise the e-lens 225, which functions to: (1) extract the droplet from meniscus, (2) to self-align/self-focus the droplet, and (3) to X-Y scan the ejected droplet. In certain exemplary embodiments the e-lens 225 can be formed using a 50 nm to 2 µm gap 506. The width of the e-lens 225 can vary as needed, such as from 50 nm to 5 microns in the exemplary embodiments of FIGS. 5L and 5M, which correspond to the electrode configurations shown in FIGS. 3A and 4A, respectively, before the nozzles 301a-301c shown in FIG. 3A and nozzle 401 shown in FIG. 4A have been formed.

FIG. 5N illustrate a cross-sectional view of the device shown in FIG. 5K after formation of a nozzle-etch opening in the top-side silicon nitride layer 209 in the gap 506 using a suitable process, such as electron beam lithography followed by dry etching (RIE) of the silicon nitride layer 209, for example. FIGS. 5O and 5P correspond to FIGS. 3A and 4A, respectively, after the gap has been formed in the silicon nitride layer 209, but prior to the nozzles 301a-301c being formed. The gap 506 can have a suitable width that spans between, for example, 80 nm and 2 µm for certain exemplary embodiments, depending on the needs of the system or application. The gap 506 can be of a preselected geometry to accommodate the needs of the application or system. For example, the array of single-filament electrodes 302a-302d can be formed with a substantially square openings in the silicon nitride layer 305, which may be 50 nm to 2 µm wide in certain exemplary embodiments, as illustrated in FIG. 5O. For the electrode configuration employed with the single multi-filament nozzle 401, a substantially rectangular opening is formed in the silicon nitride layer 405 of any suitable dimension, such as 50 nm to 2 µm wide and 50 nm to several inches long in certain exemplary embodiments, as illustrated in FIG. 5P.

FIG. 5Q illustrates a cross-sectional view of the device shown in FIG. 5N during simultaneous etching of silicon substrate 213 from both the top side of the substrate 213 and from the upper inner surface of the reservoir 216 using a suitable process, such as TMAH or KOH etching. Here, the front-side and back-side etch windows are asymmetric in lateral dimensions. In this exemplary embodiment, the side walls of the etch region on both sides have a 54.7 degree inclination to the horizontal surface, which represents the <111> plane. The top-side etch self-terminates first at a short depth (e.g., 57 nm to 1.414 µm deep). The bottom-side etch also progresses by this same small depth during this time. FIGS. 5R and 5S correspond to FIGS. 3A and 4A, respectively, at this point in the fabrication process.

FIG. 5T illustrates a cross-sectional view of the device shown in FIG. 5Q at completion of the nozzle formation process. While the top-side etch terminates at the stage represented by FIG. 5Q, the bottom-side etch progresses with time and is not terminated until it meets the top-side etch. The etch is timed and terminated when a nozzle opening 508 having a desired dimension is attained, such as when the target width for the nozzle opening 508 is between 20 nm and 2 µm, for example. Exemplary target widths for the nozzle opening 508 of certain exemplary embodiments disclosed herein are between a few nm and 2 µm. FIGS. 5U and 5V correspond to FIGS. 3A and 4A, respectively, at this point in the fabrication process.

Figure 6A:
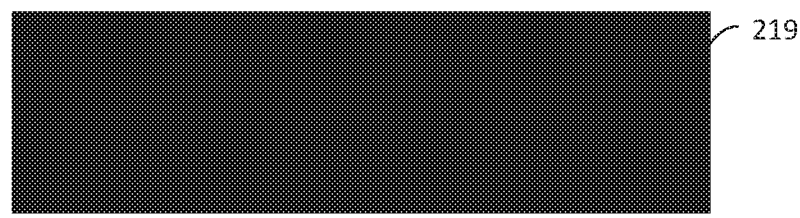
FIGS. 6A-6F demonstrate the semiconductor process that may be used to fabricate the target substrate structure shown in FIG. 2A in accordance with a representative embodiment.
Figure 6B:

FIGS. 6A-6F demonstrate the process for fabricating the target substrate structure 205 shown in FIG. 2A in accordance with a representative embodiment. The target substrate 219 can comprise a variety of materials, such as polymer, paper, silicon, etc. FIG. 6A illustrates a cross-sectional view of the target substrate 219 and FIG. 6B shows the target substrate 219 after deposition of a 50 nm thick, low-stress silicon nitride layer 218 on the back side of the substrate 219. The layer 218 can be between 50 nm and 200 nm thick in certain embodiments.

Figure 6C:
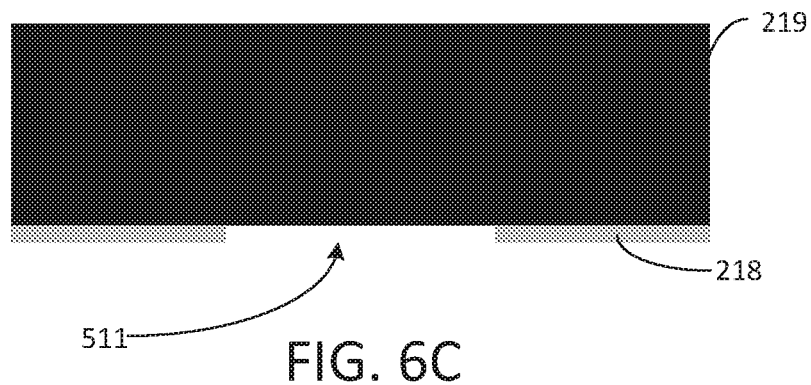
Figure 6D:
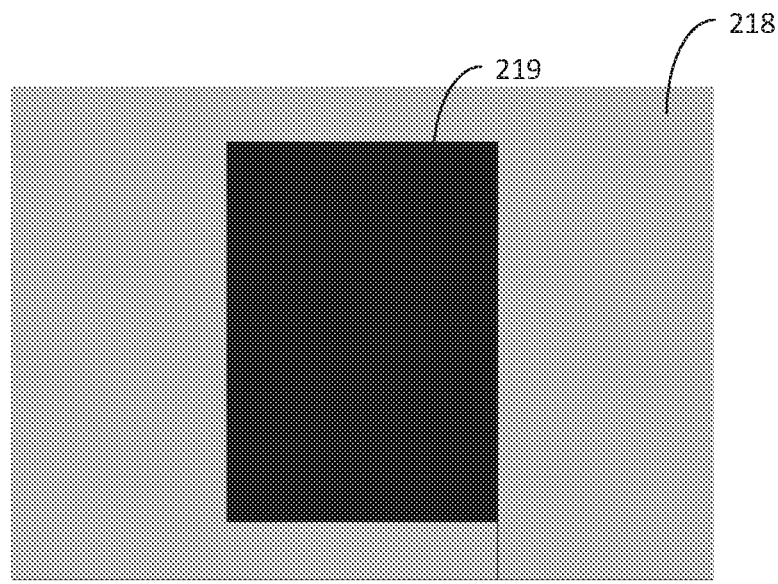

FIG. 6C illustrates a cross-sectional view of the device shown in FIG. 6A after a rectangular window 511 has been etched in the back side silicon nitride layer 218 using a suitable process such as photolithography and dry etching, e.g., RIE. The window 511 can be 5-to 200 µm wide in certain embodiments. FIG. 6D illustrates a back view of the device shown in FIG. 6C.

Figure 6E:
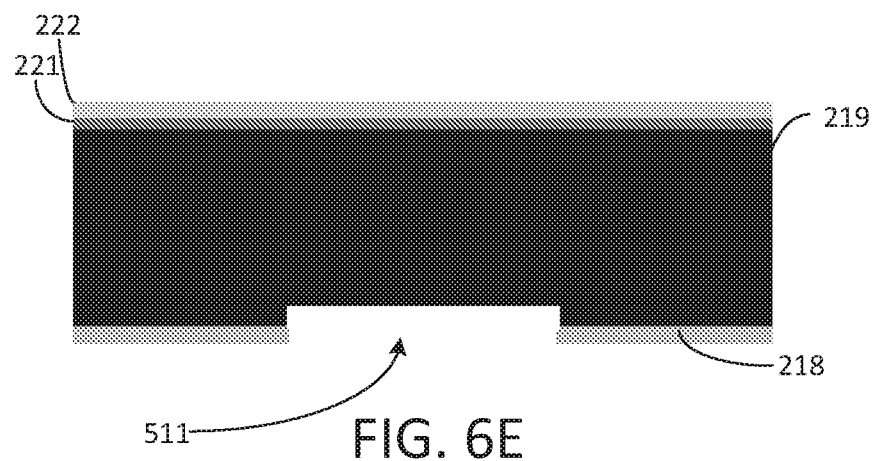
Figure 6F:
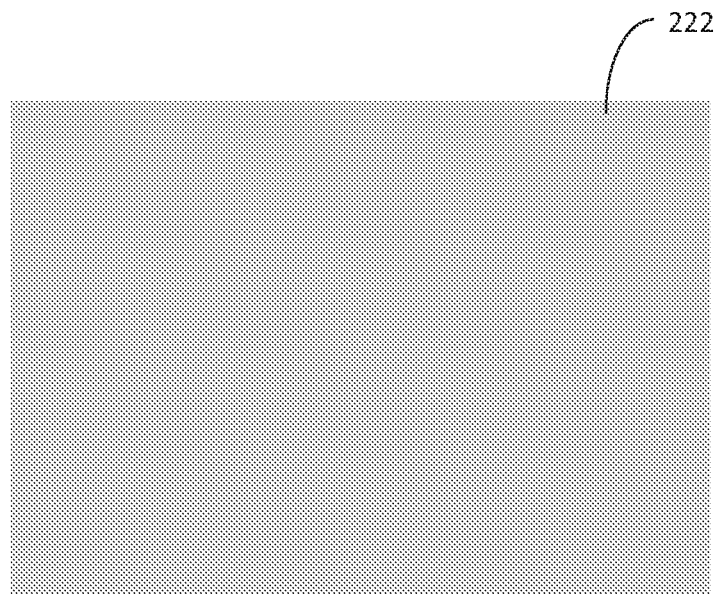
Figure 7D:
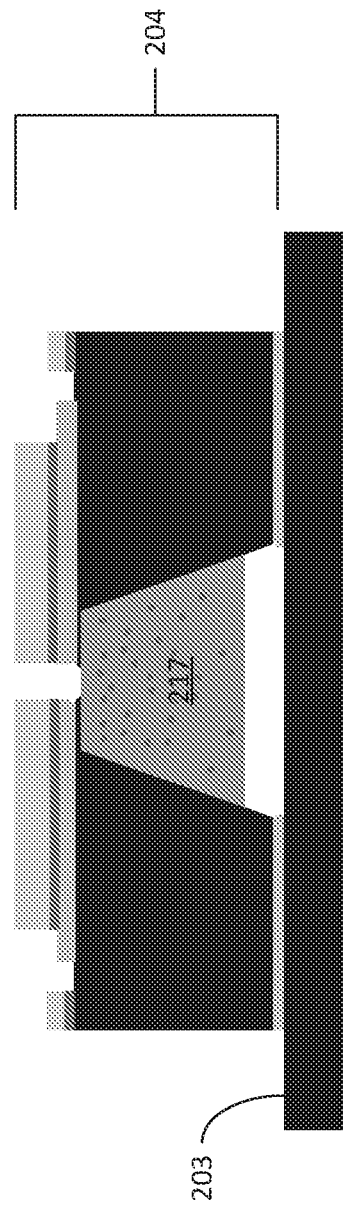

FIG. 6E illustrates a cross-sectional view of the device shown in FIG. 6C after the back side of the substrate 219 has been etched using the patterned silicon nitride layer 218 as a mask. Using the silicon nitride layer as a mask, a dry etch (i.e., RIE) can be used to etch the substrate, which may be silicon, for example, on the back side up to a depth that can be between 100 nm and 10 µm and a width that can be between 50 and 200 µm in certain representative embodiments. Formation of the exemplary target substrate structure 205 can further include removing native oxide (e.g., HF dip for 10 seconds) and then depositing the metallization layer 222 on the top side of the substrate 219. The metallization layer 222 can include any suitable materials such as, for example, a 15 nm Cr coating followed by a 135 nm Au coating for establishing electrical contact to the substrate 21. FIG. 6F illustrates a top view of the device shown in FIG. 6E FIGS. 7A-7J represent the process of assembling the carrier substrate 203 with the nanodroplet generation/control chip 204 and assembling the chip 204 with the target substrate structure 205. FIG. 7A illustrates a cross-sectional view of the chip 204 shown in FIG. 5T flipped upside down to allow the reservoir 216 to be filled with the matter from which droplets will be extracted. The matter 217 can be a nanoparticle suspension. Nanoparticle suspensions typically contain nanoparticles (metals or semiconductors) dispersed in a solvent. The step of filling the reservoir can be accomplished by flipping the chip 204 upside down and pipetting the suspension to fill the reservoir 216 as shown in FIGS. 19A, B and C, if desired. FIGS. 7B and 7C correspond to FIGS. 3A and 4A, respectively, at this point in the process.

Figure 7F:
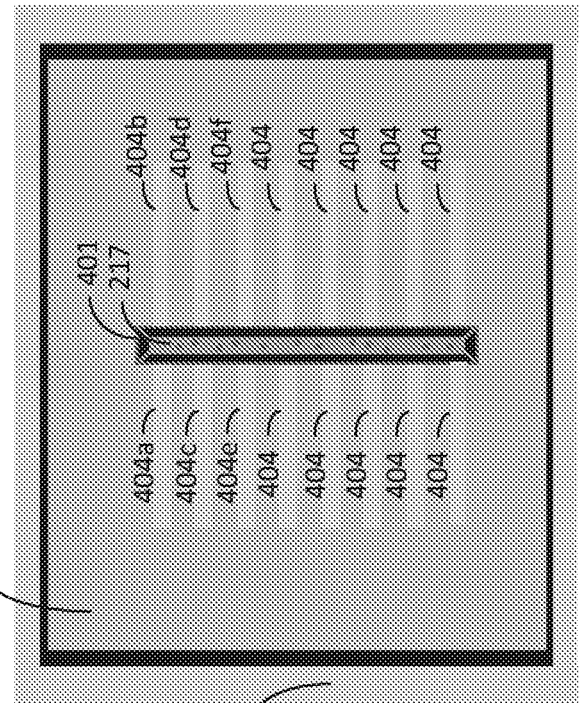
Figure 7E:
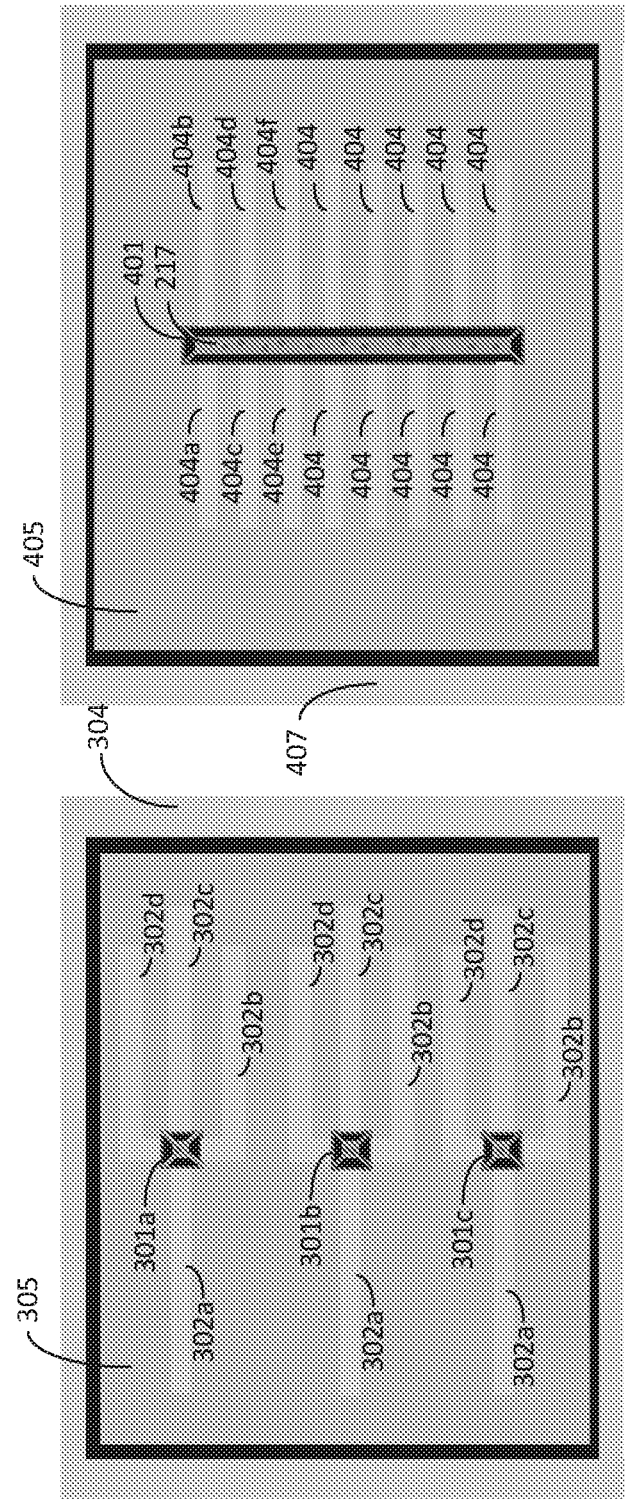

FIG. 7D illustrates a cross-sectional view of the chip 204 after the carrier substrate 203 has been attached to the chip 204 while the chi 204 is upside down and then flipping the chip 204 right-side up. FIGS. 7E and 7F correspond to FIGS. 3A and 4A, respectively, at this point in the process. The carrier substrate 203 may be any flat surface (such as another double-side polished silicon substrate). The carrier substrate 203 prevents evaporation of the fluid 217 from inside of the reservoir 216.

FIG. 7G illustrates a cross-sectional view of the device shown in FIG. 7D after the target substrate structure 205 has been placed on top of and aligned to the chip 204 using fiducials or markers, such as the fiducials or markers 306 and 406 shown in FIGS. 7H and 7I, respectively. FIGS. 7H and 7I correspond to FIGS. 3A and 4A, respectively, at this point in the process.

Figure 7J:
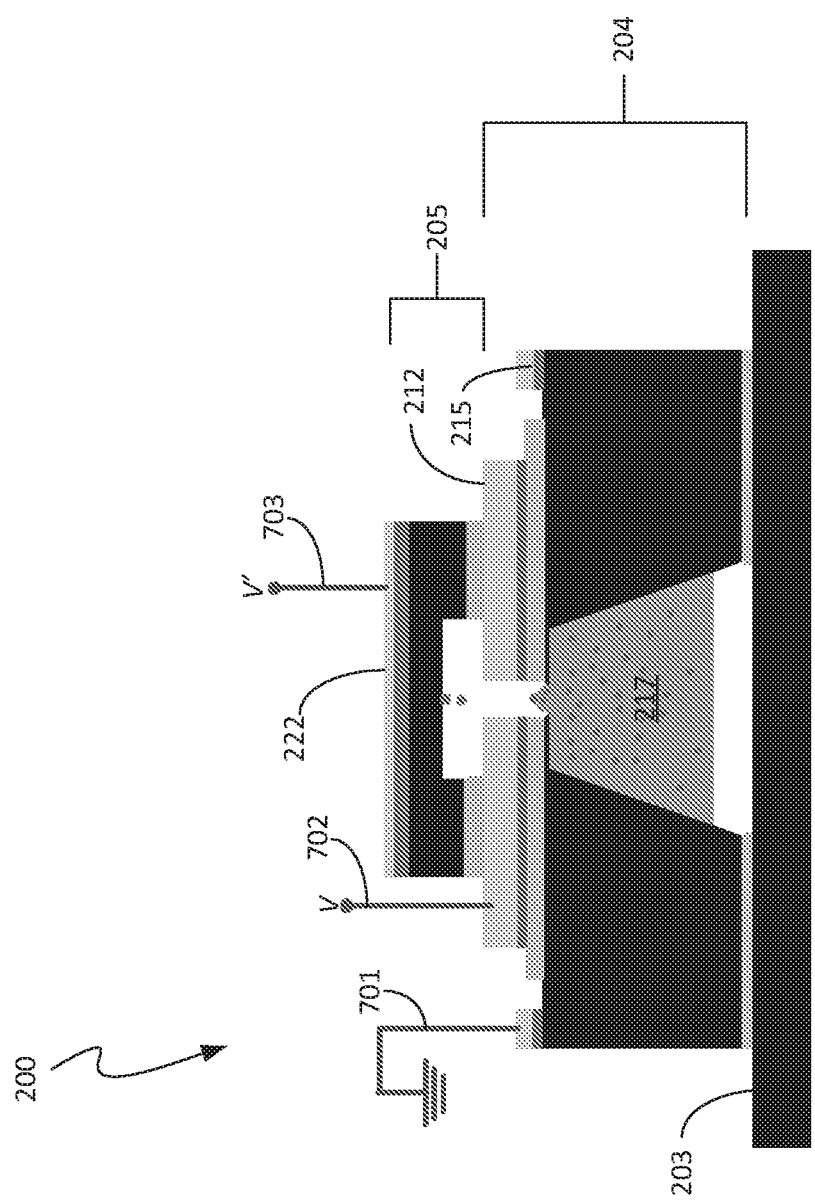

FIG. 7J illustrates a cross-sectional view of the device shown in FIG. 7G after voltage terminals 701, 702 and 703 have been secured to the metallization layers 215, 212 and 222, respectively. The device shown in FIG. 7J is identical to the atomic-to-nanoscale matter emission/flow regulation device 200 shown in FIG. 2A. As indicated above, ground potential is applied to terminal 701, a first voltage potential, V, is applied to terminal 702 and a second voltage potential, V', that is different from the first voltage potential V is applied to terminal 703. The electrical signals V and V' may be applied using, for example, a semiconductor probe-station. Thus, separate electrical signals can be applied to the e-lens at terminal 702 (i.e., V) and to the deposition electrode at terminal 703 (i.e., V').

Figure 8:
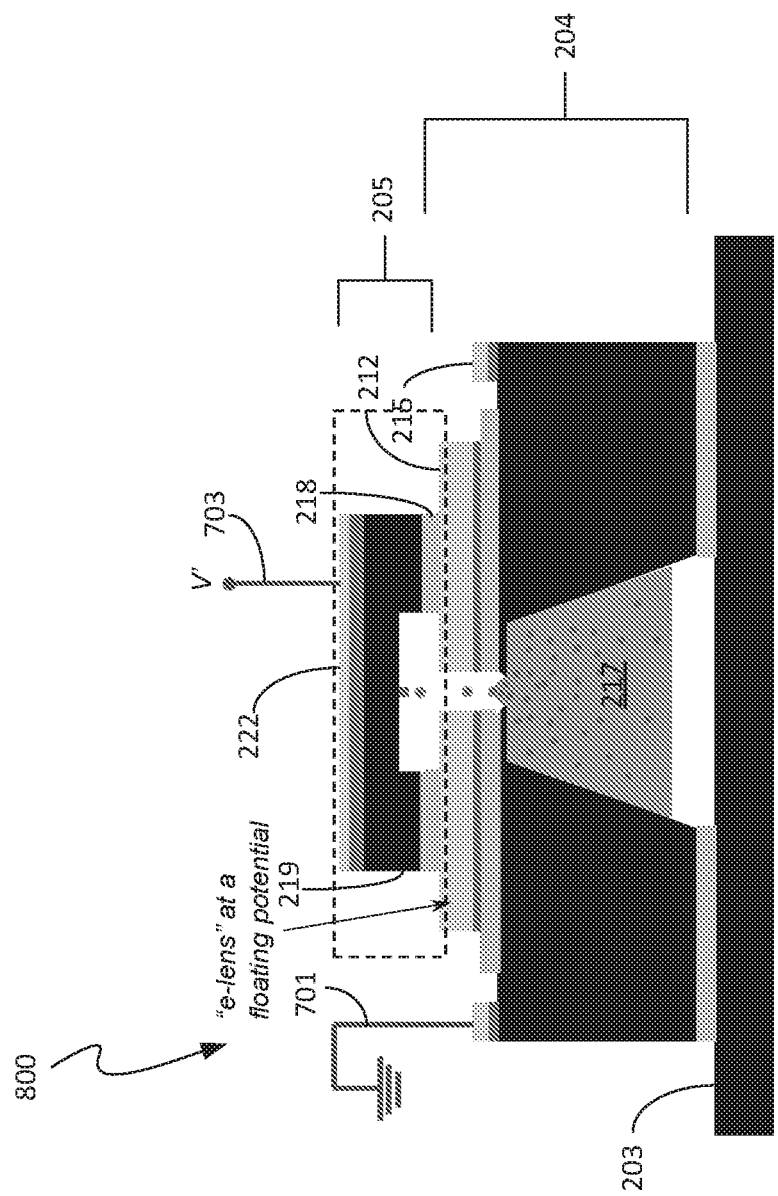
FIG. 8 illustrates a cross-sectional view of an atomic-to-nanoscale matter emission/flow regulation device that is identical to the device shown in FIGS. 2A and 7J except that one of the terminals shown in FIGS. 2A and 7J has been removed such that an electrical bias is applied only to the deposition electrode while the e-lens is held at a floating potential and assumes an electric potential based on the obtained circuit impedances.

FIG. 8 illustrates a cross-sectional view of the an atomic-to-nanoscale matter emission/flow regulation device 800 that is identical to the device 200 shown in FIGS. 2A and 7J except that the terminal 702 shown in FIG. 7J has been removed. In accordance with this representative embodiment, an electrical bias is applied only to the deposition electrode via terminal 703 (i.e., V'). The e-lens is held at a floating potential and will assume an electric potential based on the obtained circuit impedances.

Figure 9:
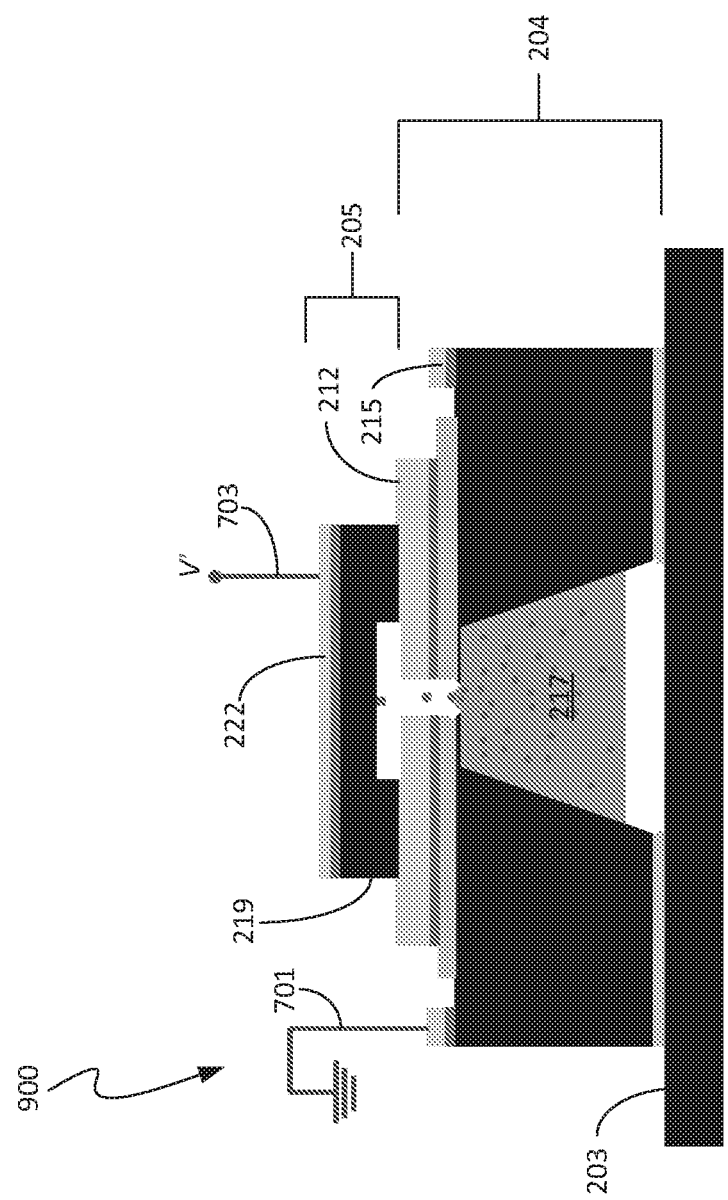
FIG. 9 illustrates a cross-sectional view of the an atomic-to-nanoscale matter emission/flow regulation device that is identical to the device shown in FIG. 8 except that the silicon nitride layer of the target substrate structure has been eliminated such that the target substrate of the target substrate structure is in direct contact with the top metallization layer of the nanodroplet generation/control chip of the atomic-to-nanoscale matter emission/flow regulation device.

FIG. 9 illustrates a cross-sectional view of the an atomic-to-nanoscale matter emission/flow regulation device 900 that is identical to the device 800 shown in FIG. 8 except that the silicon nitride layer 218 of the target substrate structure 205 shown in FIG. 2A has been eliminated and the target substrate 219 of the structure 205 is in direct contact with the metallization layer 212. In accordance with this representative embodiment, an electrical bias is applied only to the deposition electrode via terminal 703 (i.e., V'). The e-lens is shorted to the deposition electrode 222 through this physical contact and will assume the same potential as the deposition electrode 222.

Figure 10:
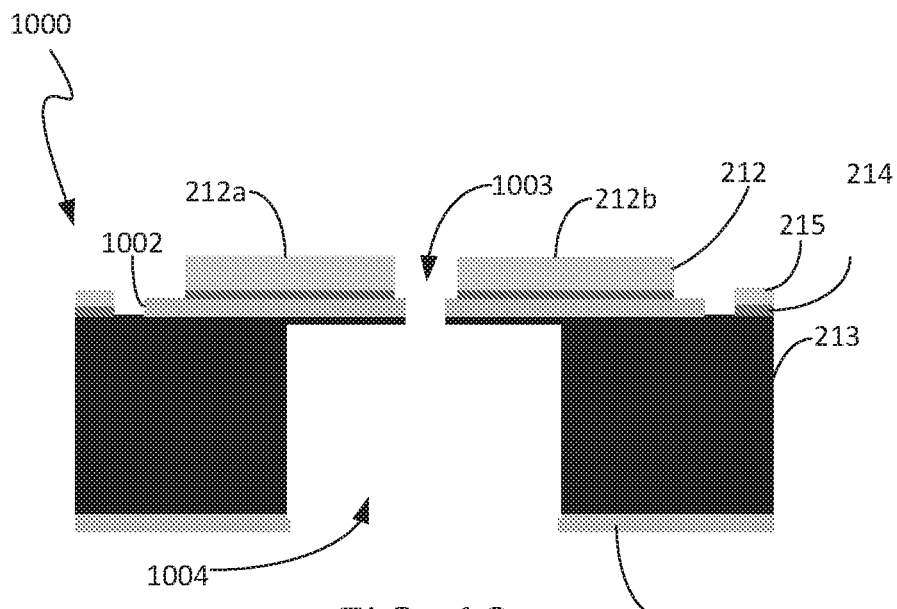
FIG. 10 illustrates a cross-sectional view of a nanodroplet generation/control chip of the atomic-to-nanoscale matter emission/flow regulation device in accordance with a representative embodiment.
Figure 11:
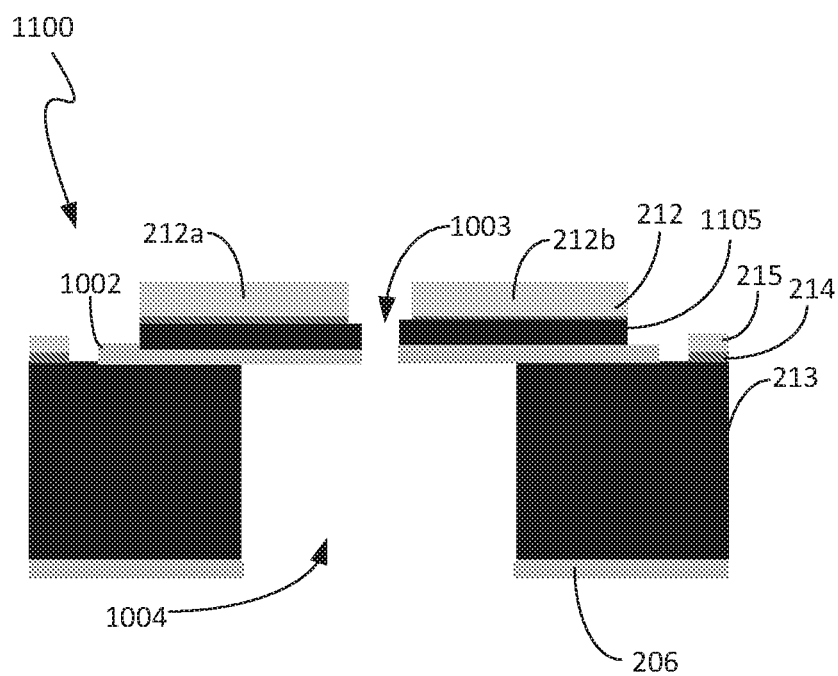
FIG. 11 illustrates a cross-sectional view of a nanodroplet generation/control chip of the atomic-to-nanoscale matter emission/flow regulation device in accordance with a representative embodiment.

FIGS. 10 and 11 illustrate cross-sectional views of a nanodroplet generation/control chip 1000 and 1100, respectively, having nozzles and reservoirs that are different from the nozzles and reservoirs depicted in FIGS. 2A-9 because they are formed by using a dry etching rather than a wet etching process. The nozzles and the reservoirs shown in FIGS. 10 and 11 have rectangular or cylindrical volumes as opposed to cone-shaped or tapered volumes. The reservoir 216 and the nozzles 201, 301 and 401 shown in FIGS. 2A, 3A and 4A, respectively, are formed using wet etching techniques, which results in them having side walls that taper. The reservoirs and nozzles can also be formed by using dry etching techniques, such as REI and deep REI (DREI) techniques. The dry-etching processes can also be used to create an array of single-filament nozzles, as depicted in FIG. 3A, or a single multi-filament nozzle, as depicted in FIG. 4A.

With reference to FIG. 10, an e-lens of suitable width (e.g., ranging from 100 nm to 2.2 µm) can be formed using a dry etching technique such as REI or DREI, for example to form a nozzle 1003 and a reservoir 1004 that have cylindrical or rectangular volumes. A suitable dielectric film layer 1002, such as a 30 nm to 200 nm thick layer of silicon nitride or silicon dioxide, for example, can be formed on the top side of the substrate 213. The nozzle 1003 of suitable width (e.g., ranging from about 50 nm to about 2 µm) is opened. Providing the nozzle 1003 with a rectangular or cylindrical aperture of a suitable width, such as from about 50 to 600 µm, allows the thickness of a Si substrate 213 to be less than 20 times the nozzle width.

For an e-lens width ranging from about 100 nm to about 2.2 µm, for example, the dielectric film layer 1002 can be, for example, about 30 nm to about 200 nm thick and the nozzle width can range from about 50 nm to about 2 µm, for example, and a rectangular or cylindrical aperture (or any other suitable geometry) having a suitable opening, such as 50 to 600 µm wide, for example can be formed.

With reference to FIG. 11, the chip 1100 has an additional silicon layer 110 disposed in between the metallization layer 212 and the dielectric film layer 1002.

Figure 12:
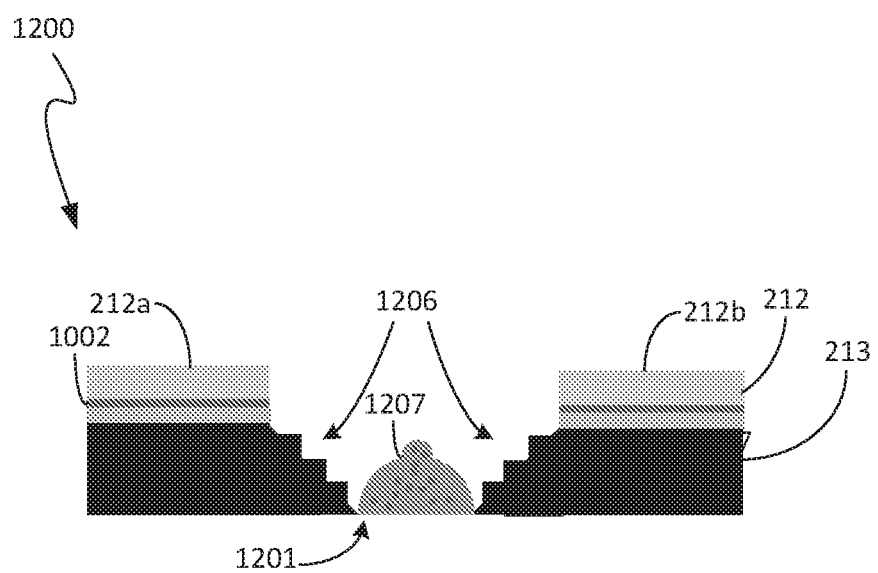
FIG. 12 illustrates a cross-sectional view of a nanodroplet column of a nanodroplet generation/control chip in accordance with another representative embodiment in which an exit side of the nozzle has stepped side walls.

FIG. 12 illustrates a cross-sectional view of a nanodroplet column of a nanodroplet generation/control chip 1200 in accordance with another representative embodiment in which the exit side of the nozzle 1201 has stepped side walls. Engineering hydrophobicity within sloped "exit" side walls of a nozzle is achievable for two reasons: (i) control over the sizing of the meniscus, and (ii) prevention of electrical shorting with the e-lens. The chip 1200 can achieve engineered hydrophobicity through a combination of one, two, or all of the following strategies:

1. Stepped "exit" sidewalls 1206. The contact angle of a surface may be increased (i.e., the surface can be made more hydrophobic or less-wetting) by increasing its surface roughness. From the Cassie-Baxter approximation, the increased contact angle, $\theta$, is related to the Young's angle, $\theta_0$, for a smooth surface as: $\cos\theta = \varphi_s (\cos\theta_0+1)-1$ where $\varphi_s$ denotes the surface fraction of the liquid-solid interface. The wet etching process creates sloped side walls at the nozzle exit with nanoscopic roughness through the formation of step-like features. This surface roughness increases the apparent contact angle and prevents the wetting of the side walls.
2. Surface coating. The wettability of sloped "exit" side walls may also be modified through a fluorinated coating. This may be achieved through a wet, HF dip or through exposure to a fluorinated plasma (dry) environment.
3. Control of filament surface-to-volume ratio. By reducing the surface-to-volume ratio of the "droplet filament" (i.e., the meniscus 1207), the surface tension of the meniscus 1207 will be increased relative to its ability to deform and wet the surface.

In accordance with the principles herein double-side polished silicon substrate with ultra-low resistivity can be employed for loading the SNAP-Chip reservoir with nanoparticle suspension. Suspension typically contains nanoparticles (metals or semiconductors) dispersed in a solvent. This step can be accomplished by flipping the chip and pipetting the suspension to fill the reservoir.

In the following discussion, it will be demonstrated that droplets as small as a few nanometers can be generated by the atomic-to-nanoscale matter emission/flow regulation device in accordance with inventive principles and concepts disclosed herein. It will also be demonstrated that the atomic-to-nanoscale matter emission/flow regulation device is capable of scanning the droplets laterally in-flight and delivering them to target substrates with 3D control in a scalable fashion and at ultra-low voltages, provided that the following nanoelectrohydrodynamics (NERD) drip-printing conditions are met:

(1) the droplet ejection nozzle is deeply miniaturized to a few tens of nanometers in lateral dimensions, thereby resulting in droplet sizes as small as a few nanometers that are delivered to the target substrate in pattern sizes near the ultimate limits of solid-state miniaturization (discussed below in more detail);

(2) the electrode configuration, which extracts precursor droplets from the nozzle through the application of an electric stress, is brought into nanoscopic proximity to the nozzle (representing a reduction in separation by more than an order of magnitude as compared to the current state-of-the-art extraction devices, thereby resulting in ultra-low droplet extraction voltages of ~10 V to 30 V;

(3) areal location (i.e., X-position and Y-position) of droplet landing is controlled by either: (a) on-demand, location controlled extraction of precursor nanodroplets from a dynamically reconfigurable multi-filament nozzle, or (b) mid-air modification of droplet flight trajectory from a single-filament nozzle; and (4) an array of independently-controlled droplet orifices are integrated into the droplet generation substrate of the atomic-to-nanoscale matter emission/flow regulation device, thereby resulting in chip-level or wafer-level parallel programmable operation of "nano-droplet column" arrays, e.g., an array of columns such as that shown in FIG. 2B disposed in a semiconductor chip or wafer.

Figure 13:
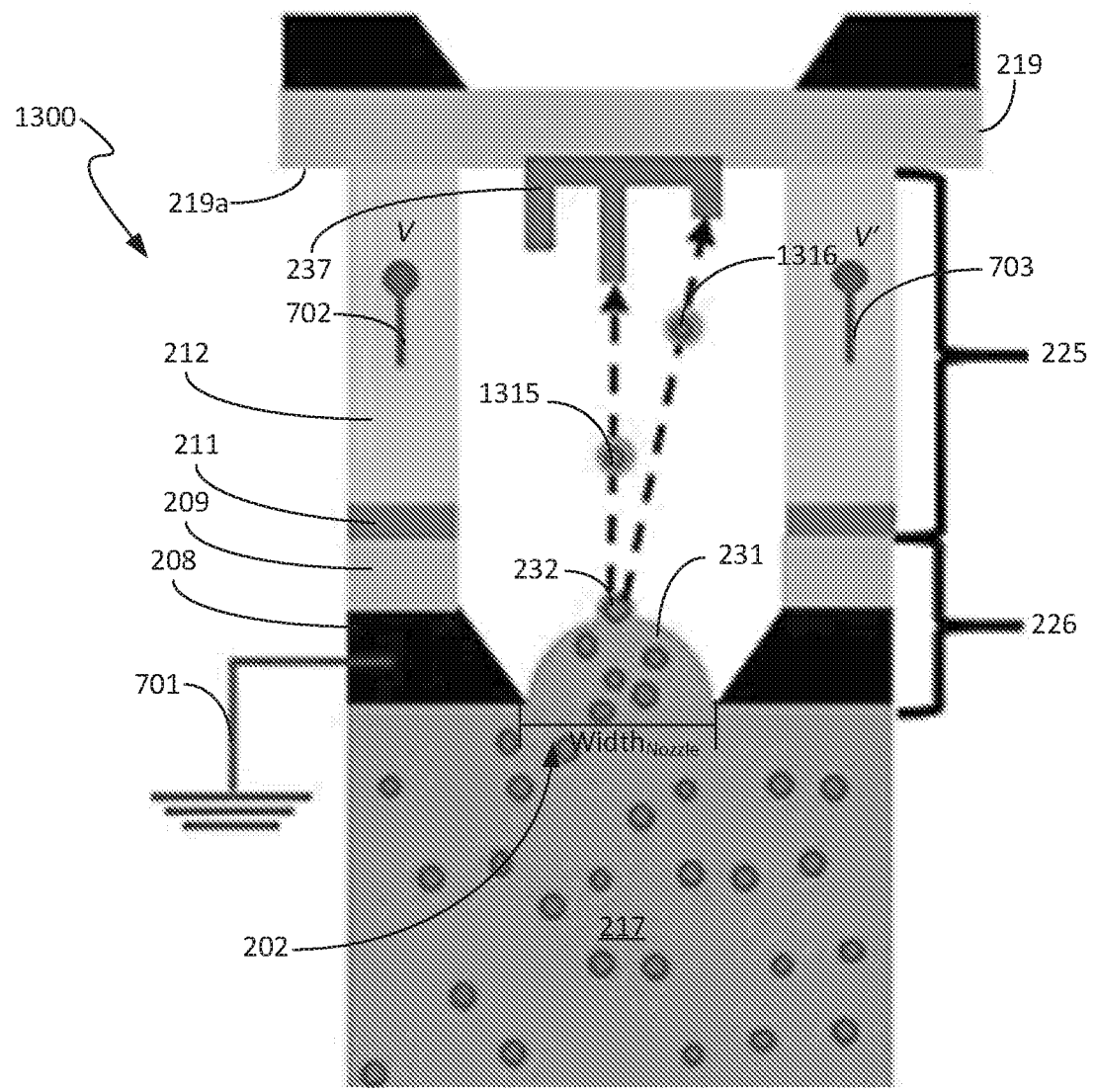
FIG. 13 illustrates a cross-sectional view of a self-aligned nanodroplet column system that may be similar or identical to any of the nanodroplet column systems of the nanodroplet generation/control chips shown in FIGS. 2B, 3A and 4A and that demonstrates in-flight deflection of nanodroplets during printing by dynamically controlling the bias voltages that are applied to the e-lens.

FIG. 13 illustrates a cross-sectional view of a self-aligned nanodroplet column system 1300 that may be similar or identical to the any of the nanodroplet column systems of the nanodroplet generation/control chips 204, 300 and 400 shown in FIGS. 2B, 3A and 4A, respectively, demonstrating in-flight deflection of nanodroplets during printing by dynamically controlling the bias voltages that are applied to the e-lens. For ease of discussion, it will be assumed that the nanodroplet column system 1300 is the nanodroplet column system 201 shown in FIG. 2B. FIG. 14 is a transmission electron microscopy (TEM) image captured by a TEM microscope of a nanodroplet column system having the configuration shown in FIG. 13. The nanodroplet column system shown in the TEM image has a nozzle that is only 40 nm in width, which is believed to be the smallest nozzle fabricated to date.

The nanodroplet generation/control chip that controls the nanodroplet column system 1300 is capable of controlling the voltage biasing scheme of the column system 1300 to cause it to perform single-axis scanning only (X-axis only or Y-axis only of an X, Y Z Cartesian coordinate system) as well as multi-axis scanning (both, X-axis and Y-axis scanning) via mid-air droplet deflection, where the X-axis and the Y-axis are perpendicular to one another and to a central axis of the droplet orifice, which is self-aligned to a central axis of the e-lens. The central axes of the droplet orifice and of the nozzle are parallel to the Z-axis of the Cartesian coordinate system. For example, when V=V', the extracted droplet 1315 is directed by the e-lens 225 along the central axis of the nozzle 202, but when V<V', the extracted droplet 1316 is deflected by the e-lens 225 to one side of the central axis of the nozzle 202. When V>V', the extracted droplet (not shown) is deflected by the e-lens 225 to the opposite side of the central axis of the nozzle 202. Thus, by controlling the values of V and V' during a write cycle, the droplets can be scanned in the X- and/or Y-directions to form a structure having a preselected shape and size in the X-, Y- and Z-dimensions.

As indicated above, a controller or processor (not shown) that may be integrated with, or external to and electrically coupled with, the atomic-to-nanoscale matter emission/flow regulation device can be used to dynamically configure the electrodes of the device in real-time to control the writing process, which, as described below in more detail, can be a direct writing process or a subtractive writing process. In this way, nanostructures having preselected shapes and sizes can be precisely formed on the target substrate.

It should be noted that although it is assumed for the demonstration discussed below that the column system 1300 has a single-droplet orifice, in other embodiments, the orifice is a multi-droplet orifice (e.g., the multi-droplet orifice shown in FIG. 4A). Also, while a single column system 1300 is shown in FIG. 13, it should be noted that a single semiconductor chip or wafer can have arrays of such column systems disposed thereon, each of which can be independently controllable to allow them to simultaneously form the same structures or different structures on a target substrate.

For this embodiment, the e-lens 225 is separated from the nozzle 202 by an e-lens-to-filament separation 226 that ranges from between about 50 nm to about 100 nm, the width of the nozzle 202, $Width_{Nozzle}$, ranges from between about 20 nm to 200 nm, and the layers 208, 209, 211, 212 and 219 comprise, respectively, highly-doped (conductive) silicon, silicon nitride, chromium, gold, and silicon nitride.

The demonstration described below uses a combination of experiments and MD simulations in two modes of operation of the atomic-to-nanoscale matter emission/flow regulation device. The two modes of operation differ in terms of the droplet fluid composition and in terms of the interaction between the droplet and the target substrate. More specifically, one mode of operations is a direct writing mode of operations that additively forms structures by delivering droplets to the target substrate that accumulate on the target substrate to form structures. The other mode of operations is a droplet nanolithography mode of operations that subtractively forms structures by delivering droplets to the target substrate that remove material of the target substrate to form structures. Both modes of operations can be performed in a controlled manner to build preselected 1D, 2D or 3D structures. Furthermore, the 2D structures that are formed can vary in the X- and Y-dimensions and the 3D structures that are formed can vary in the X, Y and Z dimensions.

FIGS. 15A-15F are cross-sectional views of the column system 1300 shown in FIG. 13 during various stages of the direct writing mode of operations. FIGS. 16A-16F are cross-sectional views of the column system 1300 shown in FIG. 13 during various stages of the nanolithography mode of operations. In FIGS. 15A-15F, the target substrate is silicon nitride and the matter 217 is a nanoparticle-laden solvent. Upon impact of the nanoparticle-laden solvent droplets with the target substrate 219, the solvent evaporates leaving the nanoparticles on the target substrate. This process of forming the structures on the target substrate 219 via deposition is referred to herein as direct writing.

It should be noted that direct writing in accordance with the inventive principles and concepts can be a single-step process in that a single step, i.e., a single write cycle, is performed to write one or more nanoparticles to the target substrate. This is in contrast to many standard semiconductor processes that require multiple steps to form structures, such as depositing photoresist, masking areas of the photoresist, patterning the photoresist via exposure and development steps, depositing the material onto the target substrate through the patterned photoresist to form structures, removing the photoresist, and then typically repeating these steps a number of times with different masks. With the direct write process, assuming the nozzle 202 is in the correct position relative to the target substrate, extraction is performed to cause one or more nanoparticles to be deposited on the target substrate.

In addition, the atomic-to-nanoscale matter emission/flow regulation device in accordance with the inventive principles and concepts disclosed herein is capable of forming structures that are smaller than the structures that can be formed by state-of-the-art semiconductor processes such as photolithographic processes, atom deposition and ion beam implantation. Due to the ability to make the nozzles disclosed herein as small as a few nanometers, the atomic-to-nanoscale matter emission/flow regulation devices disclosed herein are capable of forming structures that are less than 10 nm in size. Current state-of-the-art semiconductor processes, such as e-beam lithography, for example, are not capable of forming structures that are this small.

Figure 15C:
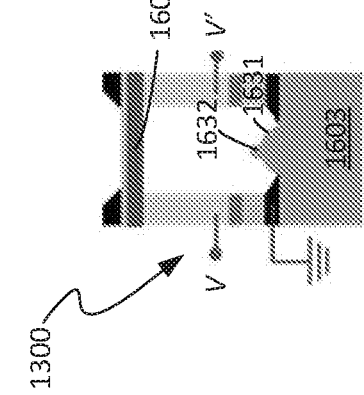
FIGS. 15A-15F are cross-sectional views of the column system shown in FIG. 13 during various stages of the nanolithography mode of operations during which structures are subtractively formed on a target substrate.
Figure 15F:
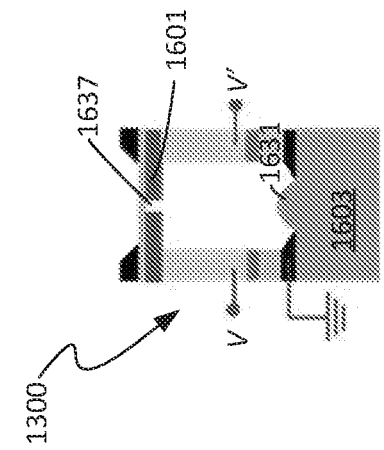
Figure 15B:
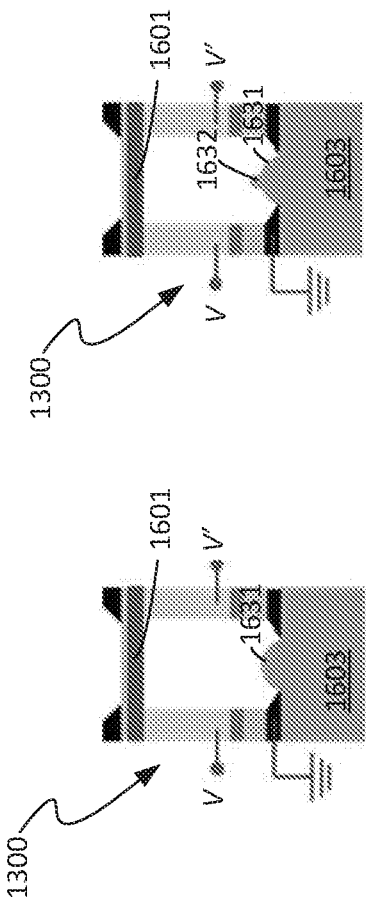
Figure 15E:
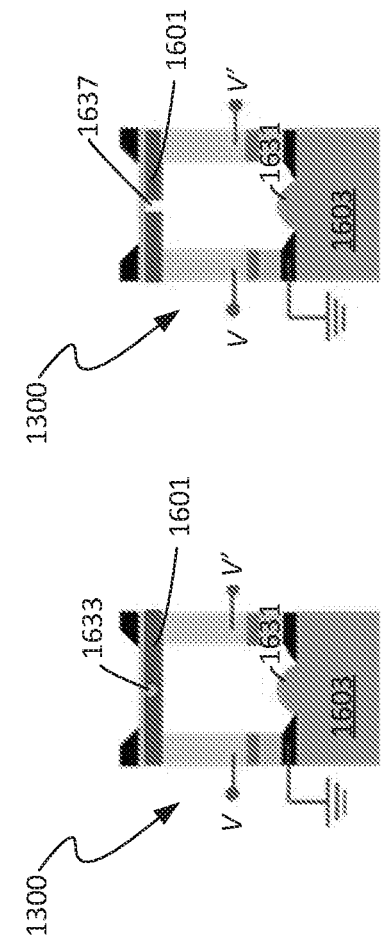
Figure 15A:
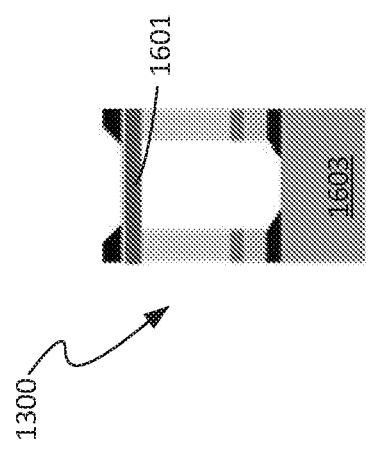
Figure 15D:
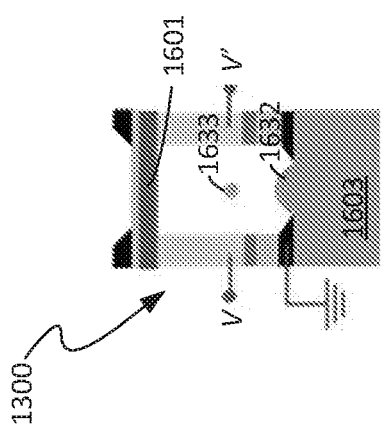

FIG. 15A depicts the column system 1300 before the direct writing cycle begins. FIG. 15B depicts the column system 1300 at the very beginning of a direct write cycle when biasing of the e-lens begins and causes the meniscus or filament 231 to form. FIG. 15C depicts the formation of the pendant droplet 232 from the filament 231. FIG. 15D depicts extraction of the droplet 233 from the filament 231. FIG. 15E depicts deposition of the droplet 233 on the target substrate 219. FIG. 15F depicts evaporation of the solvent to form a metallic nanostructure 237.

With respect to the nanolithographic process depicted in FIGS. 16A-16F, FIG. 16A depicts the column system 1300 before the nanolithographic, or substrative writing, process begins. As with the direct write process depicted in FIGS. 15A-15F, the nanolithographic process is a one-step process in that a structure can be formed in a single cycle. For the nanolithographic process, the matter 1603 is a material that, when deposited on the target substrate 1601, etches the substrate 1601. The matter 1603 is typically a solvent that etches the material comprising the substrate 1601, and thus the matter 1603 that is chosen depends on the material comprising the target substrate 1601, which will depend on the application.

Figure 16:
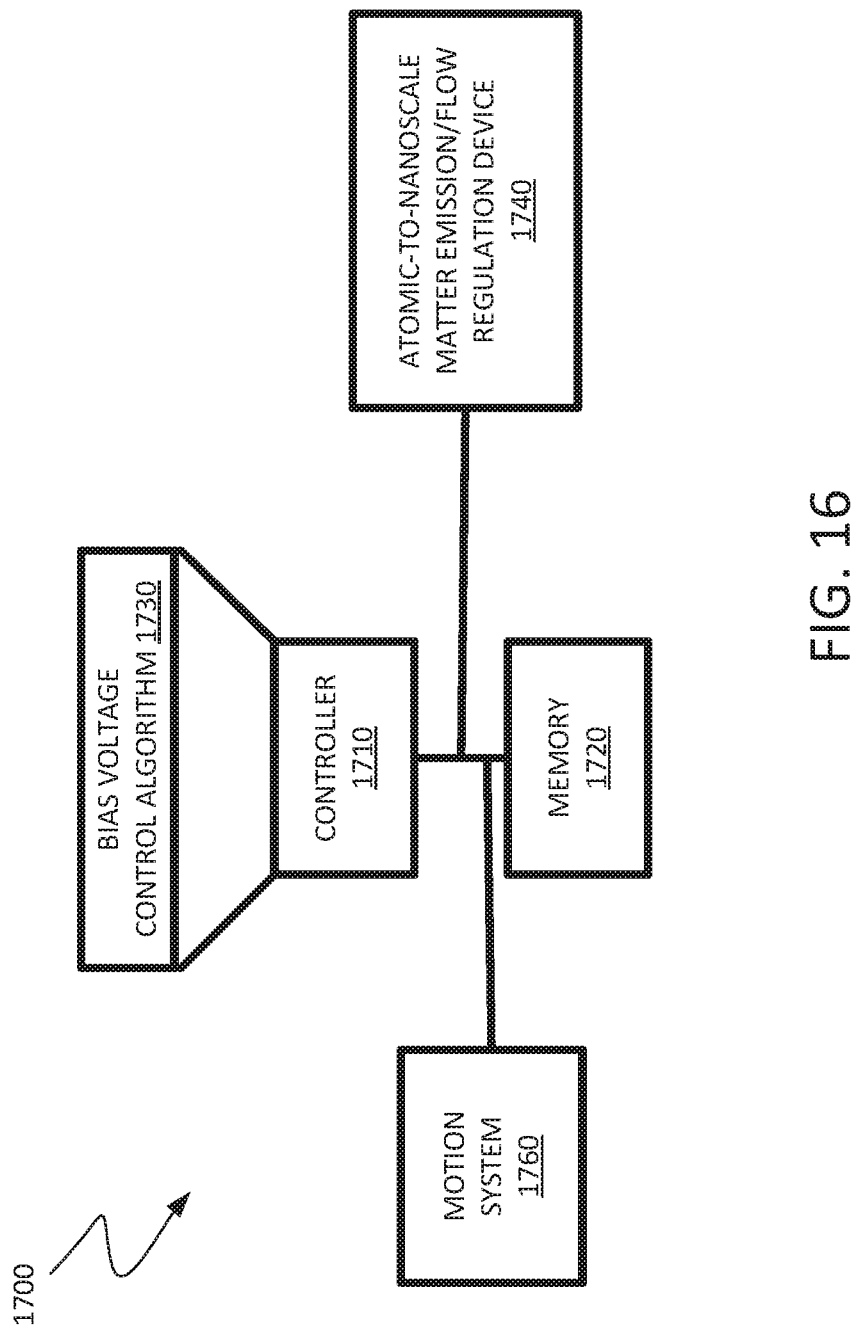
FIG. 16 is a block diagram of a control system for controlling the bias voltages applied to the electrodes of the atomic-to-nanoscale matter emission/flow regulation device in accordance with a representative embodiment.

FIG. 16B depicts the column system 1300 at the very beginning of a subtractive write cycle when biasing of the e-lens begins and causes the meniscus or filament 1631 to form. FIG. 16C depicts the formation of the pendant droplet 1632 from the filament 1631. FIG. 16D depicts extraction of the droplet 1633 from the filament 1631. FIG. 16E depicts deposition of the droplet 1633 on the target substrate 1601. FIG. 16F depicts the etched substrate 1601 to form a nanostructure 1637.

FIG. 17 is a block diagram of a control system 1700 for controlling the bias voltages applied to the electrodes of the atomic-to-nanoscale matter emission/flow regulation device in accordance with a representative embodiment. The controller 1710 is configured to perform a bias voltage control algorithm 1730 in hardware, software and/or firmware. The system 1700 may include a memory device 1720 for storing data and/or computer code for execution by the controller 1710. The system 1700 may also include a motion system 1760 that is controlled by the controller 1710 to create relative motion between the target substrate structure and the column system or array of column systems.

The controller 1710 is electrically coupled to the electrodes of the nanodroplet generation/control chip and controls the preselected bias voltages that are applied to the electrodes of the device 1740 to cause nanodroplets extracted through the nanodroplet orifice to be directed along the common central axis away from the nanodroplet orifice or to be deflected in-flight in at least one of an X-direction and a Y-direction, where the X- and Y-directions are perpendicular to the common central axis of the e-lens and the nozzle. As indicated above, the device 1740 may comprise, for example, arrays of nanodroplet columns of the type shown in FIGS. 3A-3B and/or in FIGS. 4A-4B, for example, in which case the controller 1710 may control the bias voltage signals applied to the electrodes of all of the columns. In addition, the controller can simultaneously apply the same or different bias voltage signals to the electrodes of the columns to cause the same or different structures to be simultaneously formed on the target substrate.

Aspects According to Inventive Principles and Concepts

In the description provided above, various inventive principles and concepts have been described including, but not limited to, the following. In accordance with an embodiment, an atomic-to-nanoscale matter emission/flow regulation device is disclosed comprising at least a first nanodroplet generation/control device having a front side, a back side and a first reservoir disposed in between the front side and the back side for holding matter to be extracted. The first nanodroplet generation/control device comprises at least a first nanodroplet column system comprising an upper portion of the first reservoir, a first e-lens disposed in between the upper portion of the first reservoir and the front side of the first nanodroplet generation/control device, and a first nozzle disposed in between the first e-lens and the upper portion of the first reservoir and separated from the first e-lens by a first e-lens-to-filament gap. The first e-lens includes at least a first set of at least first and second electrodes that are laterally separated from one another by a first lateral gap having a gap width. The first nozzle has a first nanodroplet orifice through which nanodroplets generated from matter held in the first reservoir are extracted out of the first reservoir through the first nanodroplet orifice when a first set of preselected voltage signals are applied to the first set of at least first and second electrodes. The first nozzle is precisely aligned with the first lateral gap and has a first nozzle width equal to a distance between innermost edges of side walls of the first nozzle. The first nozzle and the first lateral gap having a common central axis that ensures that the nanodroplets extracted through the first nanodroplet orifice self-align with the first lateral gap. The first nozzle width can be less than or equal to 300 nm.

In accordance with an embodiment, the nozzle width can be less than or equal to 150 nm.

In accordance with another embodiment, the e-lens-to-filament gap can be less than or equal to 5.0 micrometers in length.

In accordance with another embodiment, the e-lens-to-filament gap can be less than or equal to 2.0 micrometers in length.

In accordance with another embodiment, the atomic-to-nanoscale matter emission/flow regulation device is an integrated device disposed in a semiconductor chip or a semiconductor wafer.

In accordance with another embodiment, the semiconductor chip or wafer comprises a first substrate comprising a first semiconductor material, one or more first layers of insulation disposed on the front side of the first substrate, and one or more first metal layers disposed on a top surface of the one or more first layers of insulation. A first reservoir extends from the backside of the first substrate to an inlet of the first nozzle that is formed in the front side of the first substrate. The first nozzle has an exit side having side walls that extend away from the central axis of the first nozzle. The one or more first layers of insulation form a first e-lens-to-filament gap that separates the first e-lens from the first nozzle by a distance equal to a length of the first e-lens-to-filament gap. An opening in the one or more first layers of insulation has a width equal to the gap width of the first lateral gap and extends from top edges of the side walls of the first nozzle. The more first metal layers have an opening therein that is laterally aligned with the opening in the first layer of insulation to form the first lateral gap. Portions of the one or more first metal layers disposed on opposite sides of the lateral gap comprise at least first and second electrodes of a first set of at least first and second electrodes.

In accordance with another embodiment, the semiconductor chip or wafer has at least a first set of terminals that are accessible external to the semiconductor chip or wafer and electrically coupled to the at least a first set of at least first and second electrodes to allow a first set of preselected voltage signals to be applied to said at least a first set of electrodes.

In accordance with another embodiment, a controller is external to the semiconductor chip or wafer and is electrically coupled to the at least a first set of at least first and second electrodes. The controller is configured to control the first set of preselected voltages to cause nanodroplets extracted through the first nanodroplet orifice to be directed along the common central axis away from the first nanodroplet orifice or to be deflected in-flight in at least one of an X-direction and a Y-direction, where the X- and Y-directions being perpendicular to the common central axis.

In accordance with another embodiment, the semiconductor chip or wafer comprises at least a second nanodroplet generation/control device having a front side, a back side and a second reservoir disposed in between the front side and the back side of the second nanodroplet generation/control device for holding matter comprising nanoparticles. The second nanodroplet generation/control device comprises at least a second nanodroplet column system comprising an upper portion of the second reservoir, a second e-lens disposed in between the upper portion of the second reservoir and the front side of the second nanodroplet generation/control device, and a second nozzle disposed in between the second e-lens and the upper portion of the second reservoir and separated from the second e-lens by a second e-lens-to-filament gap. The second e-lens includes at least a second set of at least first and second electrodes that are laterally separated from one another by a second lateral gap having a second gap width. The second nozzle has a second nanodroplet orifice through which nanodroplets generated from matter held in the second reservoir are extracted out of the second reservoir through the second nanodroplet orifice when a second set of preselected voltage signals are applied to the second set of at least first and second electrodes. The second nozzle is precisely aligned with the second lateral gap and has a second nozzle width. The second nozzle and the second lateral gap have a common central axis that ensures that the nanodroplets extracted through the second nanodroplet orifice self-align with the second lateral gap. The second nozzle width can be less than or equal to 300 nm.

In accordance with another embodiment, the semiconductor chip or wafer comprises a first substrate comprising a first semiconductor material and having a back side and a front side corresponding to the back side and the front side, respectively, of the first and second nanodroplet generation/control devices, one or more first layers of insulation disposed on the front side of the first substrate, one or more first metal layers disposed on a top surface of said one or more first layers of insulation. The first and second reservoirs extend from the backside of the chip substrate to the inlets of the first and second nozzles, which are formed in the front side of the first substrate and have respective exit sides having side walls that extend away from the central axes of the first and second nozzles, respectively. The one or more first layers of insulation form the first and second e-lens-to-filament gaps and separate the first and second e-lenses from the first and second nozzles, respectively, by a distance equal to a length of the first and second e-lens-to-filament gaps, respectively. First and second openings in the one or more first layers of insulation have first and second widths, respectively, equal to the first and second gap widths, respectively, and extend from top edges of the side walls of the first and second nozzles, respectively. The one or more first metal layers have first and second openings therein that are laterally aligned with the first and second openings, respectively, in the one or more first layers of insulation to form the first and second lateral gaps, respectively. Portions of the one or more first metal layers disposed on opposite sides of the first and second lateral gaps comprise the first and second sets, respectively, of at least first and second electrodes.

In accordance with another embodiment, the semiconductor chip or wafer has at least first and second sets of terminals that are accessible external to the semiconductor chip or wafer and electrically coupled to the first and second sets of at least first and second electrodes to allow first and second sets of preselected voltage signals to be applied to the first and second sets of electrodes.

In accordance with another embodiment, a controller that is external to the semiconductor chip or wafer and electrically coupled to the first and second sets of at least first and second electrodes, respectively, is configured to control the first and second sets of preselected voltages to cause nanodroplets extracted through the first and second nanodroplet orifices to be directed along respective first and second orifice axes, respectively, of the first and second nanodroplet orifices, respectively, or to be deflected in-flight in at least one of an X-direction and a Y-direction, where the X- and Y-directions being perpendicular to the first and second nanodroplet orifice axes.

In accordance with another embodiment, the first nozzle is a multi-filament nozzle having at least first and second filaments arranged in a lengthwise direction of the first nozzle. The first nozzle extends in a lengthwise direction that is perpendicular to the widthwise direction of the first nozzle by a first nozzle length that is greater than the first nozzle width. The at least a first set of at least first and second electrodes comprises at least first and second sets of at least first and second electrodes. The first and second electrodes of the first set of at least first and second electrodes are disposed on opposite sides of the first filament. The first and second electrodes of the second set of at least first and second electrodes are disposed on opposite sides of the second filament. The first set of terminals comprises at least first and second terminals that are electrically coupled to the first and second electrodes, respectively, of the first set of electrodes. The second set of terminals comprises at least first and second terminals that are electrically coupled to the first and second electrodes, respectively, of the second set of electrodes. The controller is electrically coupled to the first and second sets of terminals to allow first and second sets of preselected voltage signals to be independently applied to the first and second sets of electrodes, respectively. The controller is configured to control the first and second sets of preselected voltages to cause nanodroplets to be extracted through the nanodroplet orifice.

In accordance with another embodiment, the side walls of the nozzles are sloped.

In accordance with another embodiment, the side walls of the nozzles are stepped.

In accordance with another embodiment, a method of fabricating an atomic-to-nanoscale matter emission/flow regulation device comprises steps of:

in a first substrate comprising a first semiconductor material, forming at least a first reservoir that extends in between a front side of the first substrate and a back side of the first substrate for holding matter comprising nanoparticles;

forming one or more first layers of insulation on the front side of the first substrate, where the one or more first layers of insulation have a thickness equal to a length of a first e-lens-to-filament gap;

forming one or more first patterned metal layers on a top surface of the one or more first layers of insulation, where the one or more first patterned metal layers have at least a first gap therein that extends through said one or more first metal layers and has a first gap width, and where opposite sides of said one or more metal layers define the first gap and comprise first and second electrodes of a first e-lens;

using the one or more first patterned metal layers having the first gap therein as a mask during an etching process to etch at least a second gap in said one or more first layers of insulation, where the second gap extends through the one or more layers of insulation, has a width equal to the gap width, and is laterally aligned with the first gap; and using the one or more first metal layers and the one or more first layers of insulation having the first and second gaps therein, respectively, as a mask during an etching process to etch a nozzle in the front side of the first substrate that extends into the first reservoir. The nozzle has an inlet side disposed inside of the first reservoir and an exit side disposed in the second gap. The nozzle has a nozzle width that can be less than or equal to 5.0 micrometers. The nozzle and the first and second gaps have a common central axis, and the one or more layers of insulation separate the nozzle from the e-lens by a distance equal to the length of the e-lens-to-filament gap.

In accordance with another embodiment, a printing method is provided comprising:

providing a first nanodroplet printer comprising at least a first nanodroplet column system comprising an upper portion of a first reservoir, a first e-lens, a first nozzle having a first nozzle width, and a first layer of insulation material disposed in between the first e-lens and the first nozzle and separating the first e-lens from the first nozzle by a first e-lens-to-filament gap; the first reservoir has matter therein that includes nanoparticles and has inlet side disposed in the upper portion of the first reservoir and an exit side disposed in the first e-lens-to-filament gap; the exit side of the first nozzle has side walls that extend away from a common central axis of the first nozzle and the first e-lens; centers of the first nozzle and the first e-lens are precisely aligned along the common central axis such that there is zero misalignment between the centers of the first nozzle and the first e-lens; the first e-lens includes at least a first set of at least first and second electrodes that are laterally separated from one another by a first lateral gap having a first gap width; a printable substrate is mounted on a front side of the first nanodroplet printer in alignment with the first nanodroplet printer; and applying a first set of voltage signals to the first set of at least first and second electrodes to cause a nanodroplet to be generated and extracted through a nanodroplet orifice of the first nozzle; the extracted nanodroplet self-aligns to the e-lens due to the first nozzle and the first e-lens being precisely aligned along the common central axis; the e-lens directs the extracted nanodroplet onto the printable substrate to thereby write a structure on the printable substrate.

In accordance with another embodiment, the first nozzle width can be less than or equal to 300 nm.

In accordance with another embodiment, the first nanodroplet printer is integrated into a semiconductor chip or wafer that has at a least first set of terminals that are accessible external to the semiconductor chip or wafer and that are electrically coupled to the first set of at least first and second electrodes. The step of applying the voltage signals comprises applying the first set of preselected voltage signals to the first set of electrodes to cause the nanodroplet extracted through the nanodroplet orifice to be directed along the common central axis or to be deflected in-flight in at least one of an X-direction and a Y-direction, where the X- and Y-directions being perpendicular to the common central axis.

In accordance with another embodiment, the first nozzle width is less than or equal to 10 nanometers.

In accordance with another embodiment, the method performed by the first nanodroplet printer is an additive method. The nanodroplets comprise metal particles and a solvent. After the extracted nanodroplet comes into contact with the printable substrate, the solvent evaporates leaving the metal particle on the printable substrate to form the written structure.

In accordance with another embodiment, the method performed by the first nanodroplet printer is a subtractive method used to perform lithography in a semiconductor fabrication process to pattern a layer of resist disposed on a surface of the target substrate. The nanodroplets comprise a solvent that dissolves the resist when the nanodroplet comes into contact with the resist.

In accordance with another embodiment, the method performed by the first nanodroplet printer is a subtractive method used to etch a layer of material disposed on a surface of the target substrate to form the written structure. The nanodroplets comprise a solvent that etches the material of the layer of material when the nanodroplet comes into contact with the material.

In accordance with another embodiment, the matter in the reservoir of the first nanodroplet printer is a gas that etches the material when the nanodroplet comes into contact with the material.

In accordance with another embodiment, the miniaturization of the nozzle to a nozzle width of 10 nm results in extracted nanodroplets that are approximately 1.0 nm in size (i.e., the nanodroplets can be ten times smaller than the nozzle width).

In accordance with another embodiment, an atomic-to-nanoscale matter emission/flow regulation device with a through-hole comprises a top, and a nozzle configured to facilitate atomic-to-nanoscale matter emission/flow regulation formed in an etchable nozzle substrate, the nozzle configured at the smallest cross-section of the through-hole, further comprising a bottom formed in the nozzle substrate or selectively connected to the nozzle. In accordance with another embodiment, the through-hole and the nozzle therein are configured using simultaneous or sequential etching steps in the nozzle substrate. The through-hole has asymmetric lateral dimensions for the top and a bottom surface of the nozzle substrate. In accordance with another embodiment, the etchable nozzle substrate is further defined by one or more etchable substrates containing an ultra-low resistivity material. In accordance with another embodiment, the nozzle facilitates controlled transport of liquid, gas, or solid-plus-liquid phase matter at the atomic-to-nanoscale in order to perform operations that may include but, are not limited to matter emission and/or ionization from the nozzle, its manipulation, and targeted delivery therethrough. In accordance with another embodiment, the nozzle has a rectangular opening with width ranging from a few nanometers to 2000 nanometers and with length ranging from a few nanometers to several inches. In accordance with another embodiment, an atomic-to-nanoscale matter transportation column is configured to enable self-aligned transportation and regulation of matter in the liquid, gas, or solid-plus-liquid phase. In accordance with another embodiment, the nanofluidic column is configured to enable self-aligned transportation and regulation of fluids or nanoparticle-laden fluids through a nozzle. In accordance with another embodiment, the nanofluidic column includes a nanodroplet column configured to facilitate at least one of self-aligned nano-droplet generation, extraction, manipulation, and delivery therethrough. In accordance with another embodiment, the nozzle is operatively connected to the conductive layer. In accordance with another embodiment, the column further comprises an e-lens formed in a thin-film conductive layer wherein the electrostatic lens is comprised of two or more, electrically isolated and laterally separated electrodes. In accordance with another embodiment, the e-lens has an inter-electrode gap of width W1 and an electrode width ranging from 50 nanometers to 5 microns. In accordance with another embodiment, the e-lens is comprised of either one pair of electrodes per nozzle, or one set of radially arranged electrodes per nozzle.

In accordance with another embodiment, the column further comprising an array of e-lenses positioned to be contiguous to and on both sides of a rectilinear nozzle opening. The e-lenses are configured selectively and/or dynamically in order to enable location controlled matter transport through a nozzle for at least one of material etching, and additive printing/projection printing of zero-dimensional, one-dimensional, two-dimensional or three-dimensional patterns.

In accordance with another embodiment, the nanodroplet column further comprises an array of e-lenses positioned to be contiguous to and on both sides of a rectilinear nozzle opening in order to selectively and/or dynamically create one or more nanodroplet filaments with spatial and temporal control, via the controlled polarization of selected electrodes in the e-lens array, in order to enable at least one of material etching, and projection printing of zero-dimensional, one-dimensional, two-dimensional or three-dimensional patterns.

In accordance with another embodiment, the nozzle is formed in an etchable nozzle substrate. The top-side opening in the etchable nozzle substrate measures a width that is substantially the same as W1 at the most proximate height to the e-lens and a width of W2 at the nozzle; and wherein W1 is greater than or equal to W2.

In accordance with another embodiment, the column further comprises a nozzle formed in a self-aligned configuration in an etchable nozzle substrate that underlies an e-lens.

In accordance with another embodiment, the column further comprises a first insulating layer between the nozzle and the e-lens.

In accordance with another embodiment, the column further comprises an opening in the first insulating layer of width W3, wherein W3 is substantially the same width as W1; and wherein the insulation layer opening is self-aligned to the e-lens above and to the nozzle below.

In accordance with another embodiment, the nozzle is formed of silicon and the first insulating layer contains silicon.

In accordance with another embodiment, the e-lens includes a conductive metal with a suitable adhesion layer, and wherein the thin film, first insulating layer contains silicon.

In accordance with another embodiment, the e-lens and the nozzle are disposed within the column and separated by a vertical distance ranging from 50 nanometers to 2000 nanometers.

In accordance with another embodiment, the e-lens and the nozzle are disposed within the column and separated by a horizontal distance ranging from zero nanometers to 2000 nanometers.

In accordance with another embodiment, the nanodroplet column further comprises fluid disposed in a reservoir that contains nanoparticles.

In accordance with another embodiment, the fluid containing nanoparticles is formed using materials including at least one of metal layering components, etching components, and medical treatment components.

In accordance with another embodiment, the nanodroplet column further comprises a target substrate selectively connectable to an e-lens, if desired.

In accordance with another embodiment, the nanodroplet column further comprises a fluid that forms a filament of nanoparticle ink when an electrical field is applied either between a target substrate and a nozzle or between an e-lens and the nozzle or both. The nanofluidic column comprises a reservoir on an etchable nozzle substrate for housing the nanoparticle ink.

In accordance with another embodiment, the column further comprises a flexible or rigid target substrate.

In accordance with another embodiment, the target substrate further includes at least one of: a ultra-low resistivity material, a conductive metal with a suitable adhesion layer on the back-side, a conductive metal with a suitable adhesion layer on the front-side; an insulation layer that contains silicon or aluminum or polymer, on the front-side, an insulation layer having an etched rectangular geometry, and a substantially rectangular opening underneath an insulating layer and having a lateral size that is substantially the same as the insulating layer.

In accordance with another embodiment, the column further comprises a target substrate having a portion formed of a substantially rigid or flexible material.

In accordance with another embodiment, the column further comprises a matter generation/control substrate that includes: a nozzle formed in an etchable nozzle substrate, a reservoir configured to receive a precursor material comprised of solid, liquid, and/or gas phase substances, an e-lens, a first insulating layer between the e-lens and the etchable nozzle substrate, and a second insulating layer on the bottom side of the etchable nozzle substrate.

In accordance with another embodiment, the column comprises a droplet generation/control substrate that includes: a nozzle formed in an etchable nozzle substrate, a reservoir fillable with an etchant fluid or a nanoparticle ink, one or more droplet filaments, an e-lens, a first insulating layer between the e-lens and the etchable nozzle substrate, and a second insulating layer on the bottom side of the etchable nozzle substrate.

In accordance with another embodiment, a nano droplet printer is provided that comprises a Scanning Nanodroplet Additive Printer-on-a-Chip (SNAP-Chip) configured via a dynamically reconfigurable single filament or a multi-filament nozzle. The printer is configured to deliver on-demand, location-controlled nano-droplet extraction to print 3D patterns via the nozzle filament to a substrate in an additive fashion.

In accordance with another embodiment of the printer, both the nozzle filament(s) and the substrate remain in a substantially stationary configuration during a printing procedure.

In accordance with another embodiment, the printer comprises a droplet column formed within a droplet generation/control substrate and a target substrate.

In accordance with another embodiment, the printer further comprises an e-lens and a reservoir, and the width of the nozzle is less than or equal to a width of the e-lens. The width of the droplet filament is less than or equal to the width of the nozzle, and the width of the e-lens is less than a width of the reservoir section of the printer.

In accordance with another embodiment, of the printer, the width of the nozzle ranges from a few nm to 2000 nm and the diameter of the droplet filament ranges from a few nm to 2000 nm. The width of the printed pattern remains substantially the same as that of the droplet filament and thereby, represents printing near the limits of solid-state miniaturization.

In accordance with another embodiment of the printer, the inter-electrode separation of the e-lens ranges from 50 nm to 2000 nm.

In accordance with another embodiment, a nanodroplet printing system is provided that is configured to precisely control meniscus sizing and to prevent electrical shorting of droplet filament with an e-lens. The nozzle has a nanoengineered surface roughness/texture at "exit" sidewalls of the nozzle that increases hydrophobicity of the nozzle exit sidewalls.

In accordance with another embodiment, the side walls are nanoscopically stepped exit sidewalls to increase hydrophobicity.

In accordance with another embodiment, a nanodroplet printing system is provided that is configured to precisely control surface-to-volume ratio of a droplet filament, via nozzle/meniscus sizing and/or electric fields, in order to prevent electrical shorting between the droplet filament and an e-lens. An increase in the surface tension reduces lateral deformation of the filament during droplet ejection and thereby prevents the droplet filament from wetting nozzle "exit" sidewalls/the e-lens during a printing operation.

In accordance with another embodiment, a nanodroplet printing system is provided that is configured to reduce nozzle clogging with nanoparticles through dielectrophoretic de-clogging procedures, which are triggered with the application of an AC-bias to a nozzle with respect to an e-lens.

In accordance with another embodiment, a nanodroplet printing system is provided that is configured to reduce nozzle clogging with nanoparticles through the use of a rectangular nozzle configuration, wherein the nozzle length is much larger than the nozzle width.

In accordance with another embodiment, a printing system is provided comprising a single filament or multi filament nozzle component configured to enable on demand location controlled nano-droplet extraction. The system includes an e-lens module to exert an electric field at a nanoparticle ink and is configured such that a target substrate can optionally carry a selectively applied bias to aid in droplet extraction/guidance from the filament. The system is optionally configured to operate at ambient temperature and pressure.

In accordance with another embodiment, the nanodroplet printing system comprises system components configured to extract droplet(s) from a single filament pendant/positioned at the center of a nozzle opening. An e-lens of the system comprises either one pair of electrodes per nozzle, or one set of radially arranged electrodes per nozzle such as to achieve self-alignment of droplet(s) when traversing from the filament to a target substrate and to thereby print nanostructures on the target substrate.

In accordance with another embodiment, a nanodroplet printing system is provided that comprises system components configured to extract droplet(s) from a single filament pendant/positioned at the center of a nozzle opening; system further configured to achieve mid-air control over the trajectory of droplet(s) via the selective polarization of a radially arranged set of e-lens electrodes in order to print nanostructures in three-dimensions on a target substrate without moving the nozzle or the target substrate, wherein the droplet filament is formed at the nozzle in a self-aligned fashion with respect to the e-lens, wherein deposition, mixing or etching steps are achieved by the choice of selective bias voltage pattern.

In accordance with another embodiment, the nanodroplet printing system is configured to include an array of e-lenses positioned to be contiguous to and on both sides of a rectilinear nozzle opening in order to selectively and/or dynamically form one or more nanodroplet filaments on-demand within a single nozzle (i.e., form a multifilament nozzle), with spatial and temporal control, via the controlled polarization of selected electrodes in the e-lens array. The system is configured for dynamically reconfigurable droplet ejection by controlling the electric signals applied to individual electrodes in the e-lens array in terms of signal location, duration, or other characteristic in order to form a custom printed pattern, etch, or drug mixture, or other suitable result on a target substrate.

In accordance with another embodiment, the printer employs a nanoelectrohydrodynamic printing method comprising the following step: applying a radially symmetric electric field on a nanoparticle ink at a nozzle tip, the radially symmetric electric field inducing self-aligned formation of a droplet filament at the nozzle tip, the radially symmetric electric field inducing self-aligned ejection and delivery of a droplet toward the target substrate, and repeating the applying step to form multiple and location-controlled, self-aligned droplet emission filaments on-demand and in a dynamically reconfigurable fashion within a multi-filament nozzle.

In accordance with another embodiment, a method of manufacturing a nanodroplet column and/or filament nozzle and/or nano droplet printer is provided comprising:
  etching a nozzle in an etchable nozzle substrate, where the nozzle configured to facilitate atomic-to-nanoscale matter emission/flow;
  forming an insulating layer; and
  optionally, forming an e-lens having a diameter that is greater than the diameter of the nozzle. The insulating layer is disposed between the nozzle and the e-lens.

In accordance with another embodiment, the SNAP-Chip printer the printer assembly and operation methodology includes the following:
  loading of the reservoir with the nanoparticle ink while the droplet generation/control substrate is placed upside-down, such that the e-lens is positioned at the bottom side flipping the droplet generation/control substrate to its desired orientation, such as where the e-lens is positioned on the top side;
  placing the target substrate on top of the droplet ejection/control substrate and selectively aligning the two substrates using alignment markers under an optical microscope/aligner; and
  applying an electric field on the nanoparticle ink at the nozzle tip to form droplet filament(s) and thereby, enable SNAP-Chip operation.

In accordance with another embodiment, the SNAP-Chip printer biasing methodology for droplet ejection include the following steps:
  applying two distinct and independently controlled voltage signals to the e-lens and to the bulk of the target substrate with respect to the nanoparticle ink; or
  applying an electrical bias only to the bulk of the target substrate with respect to the nanoparticle ink, while the e-lens is held at a floating potential; or
  applying an electrical bias only to the bulk of the target substrate with respect to the nanoparticle ink, while the e-lens is electrically shorted to the target substrate via direct physical contact.

In accordance with another embodiment, the column further comprises a second insulating layer with a rectangular opening measuring rectangular dimensions that are substantially the same as that of the bottom-side opening of the etchable nozzle substrate.

In accordance with another embodiment of the printer, the e-lens and the nozzle are disposed within the column and separated by a vertical distance ranging from 50 to 2000 nm.

In accordance with another embodiment, the e-lens and the nozzle are disposed within the column and separated by a horizontal distance ranging from zero to 2000 nm.

In accordance with another embodiment of the SNAP-Chip printer, an array of such printers are created in a single monolithic substrate for scalable and parallel printing/etching of patterns on a target substrate.

In accordance with another embodiment, the process for manufacturing the atomic-to-nanoscale matter emission/flow regulation systems and/or devices can include:
  depositing an insulating film on a top and bottom of an etchable substrate, one or more openings formable on the top of the substrate, an adhesion layer and a substrate contact metallization layer formable at the one or more openings, a bottom opening formable in the bottom insulating layer, and a reservoir or bottom formable via the bottom opening, where the openings and reservoir can be formed using a wet or dry etching process, or other suitable process. The process can include the steps of forming an e-lens comprising micro-to-nanoscopically-sized electrodes with varying designs and inter-electrode widths on top of the insulating layer at the top-side of the substrate. The e-lens can comprise a stack of adhesion and functional metal layers. The process can include etching the insulating layer on the top-side of the substrate to form an opening enveloping the inter-electrode gap regions of the e-lens, and/or simultaneously etching of the substrate from the top- and back-sides to form the nozzle.

In accordance with another embodiment of the printer, the e-lens and the nozzle are disposed within a droplet column and separated by a vertical distance ranging from 50 nm to 2000 nm.

In accordance with another embodiment of the printer, the e-lens and the nozzle are disposed within a droplet column and separated by a horizontal distance ranging from zero nm to 2000 nm. The extreme miniaturization of the printer components results in ultra-low deposition voltages that are as low as 5 volts, and up to 100 volts.

For example, a device with a through-hole can include a top, and a nozzle configured to facilitate atomic-to-nanoscale matter emission/flow regulation formed in an etchable nozzle substrate, with the nozzle being configured at the smallest cross-section of the through-hole. The device can include a bottom formed in the nozzle substrate or selectively connected to the nozzle.

In an exemplary embodiment, the through-hole of the device and the nozzle therein can be configured using simultaneous or sequential etching steps in the nozzle substrate. The through-hole can have asymmetric lateral dimensions for the top and a bottom surface of the nozzle substrate, if desired. The etchable nozzle substrate can be defined by one or more etchable substrates containing an ultra-low resistivity material. The nozzle can facilitate controlled transport of liquid, gas, or solid-plus-liquid phase matter at the atomic-to-nanoscale range in order to perform operations that may include, but are not limited to, matter emission and/or ionization from the nozzle, its manipulation, and targeted delivery therethrough. Applications for these operations may range from printing structures, quantum computing, droplet-based nano-/micro-lithography, scanning probe tools, material etching via ions/fluids/plasmas on rigid or flexible substrates, and discovery of drugs/molecular compounds.

The nozzle can have a rectangular opening with a suitable width, such as ranging from a few nanometers to 2000 nanometers, or any other suitable width and with suitable length, such as ranging from a few nanometers to several inches, or any other suitable length.

In accordance with the inventive principles and concepts disclosed herein, an atomic-to-nanoscale matter transportation column can be configured to enable self-aligned transportation and regulation of (the frequency at which matter is ejected from the nozzle is controlled in part by the electric field) matter in the liquid, gas, or solid-plus-liquid phase.

In an embodiment, a nanofluidic column can be configured to enable self-aligned transportation and regulation of fluids, such as nanoparticle-laden fluids, through a nozzle. The nanofluidic column can include a nanodroplet column, which can be similar to an electron column in an electron microscope, configured to facilitate at least one of self-aligned nano-droplet generation, extraction, manipulation, and delivery therethrough. The nanodroplet column can facilitate self-aligned droplets through the nozzle and can comprise a conductive layer, with the nozzle being operatively connected to the conductive layer.

The column can comprise an electrostatic lens (e-lens) formed in a thin-film conductive layer wherein the e-lens is comprised of two or more, electrically isolated and laterally separated electrodes. In accordance with an embodiment, the e-lens has an inter-electrode gap of width W1 and an electrode width ranging from 50 nanometers to 5 microns. The e-lens of the column can include either one pair of electrodes per nozzle, or one set of radially arranged electrodes per nozzle. The column can include an array of e-lenses, with the e-lenses being positioned to be contiguous to and on both sides of a rectilinear nozzle opening. The e-lenses can be configured selectively and/or dynamically in order to enable location controlled matter transport through a nozzle for at least one of material etching, additive printing, subtractive printing, lithography, scanning probe-based material modification/patterning, and projection printing of zero-dimensional, one-dimensional, two-dimensional or three-dimensional patterns.

In one or more embodiments, the column can include an array of e-lenses, with the e-lenses being positioned to be contiguous to and on both sides of a rectilinear nozzle opening in order to selectively and/or dynamically create one or more nanodroplet filaments with spatial and temporal control, via the controlled polarization of selected electrodes in the e-lens array, in order to enable at least one of material etching and projection printing of zero-dimensional, one-dimensional, two-dimensional or three-dimensional patterns.

In certain embodiments, the nozzle can be formed in an etchable nozzle substrate wherein the top-side opening in the etchable nozzle substrate measures a width that is substantially the same as W1 at the most proximate height to the e-lens and a width of W2 at the nozzle, where W1 is greater than or equal to W2.

The column can include a nozzle formed in a self-aligned configuration in an etchable nozzle substrate that underlies an e-lens. The column can include a first insulating layer between the nozzle and the e-lens. The column can include an opening in the first insulating layer of width W3, where W3 is substantially the same width as W1, with the insulation layer opening being self-aligned to the e-lens above and to the nozzle below. The nozzle of the column can be formed of silicon and the first insulating layer can contain silicon. The e-lens of the column can include a conductive metal with a suitable adhesion layer, such as, for example, titanium and gold, or chromium and gold, although any other suitable metal or combination of metals may be used to construct the e-lens. The thin film, first insulating layer can contain silicon. The column can be configured with the e-lens and the nozzle being disposed within the column and separated by a suitable vertical distance, such as a distance ranging from 50 nanometers to 2000 nanometers, or any other suitable distance. The column can be configured with the e-lens and the nozzle disposed within the column and separated by a horizontal distance ranging from zero nanometers to 2000 nanometers.

The column can include a fluid disposed in a reservoir. The fluid can contain nanoparticles (referred to herein as "nanoparticle ink"). It should be noted, however, that the fluid is not required in all cases to contain nanoparticles. In some applications or embodiments, the fluid does not contain particles. Thus, the term "fluid," as used herein, can mean a fluid that contains nanoparticles, or nanoparticle ink, as well as fluids that do not contain nanoparticles. The nanoparticle ink can be defined as a fluid containing nanoparticles formed using materials including at least one of metal layering components, etching components, and medical treatment components. The column can include a target substrate selectively connectable to an e-lens, if desired. The column can include a fluid that forms a filament when an electrical field is applied either between a target substrate and the nozzle or between an e-lens and the nozzle, or both. The column can comprise a reservoir on an etchable nozzle substrate for housing the fluid. The column can comprise any flexible or rigid target substrate, such as, for example, silicon, paper, polymer, or some other suitable material.

The column can be configured so that it is connectable, directly or indirectly, if desired, to a target substrate. The target substrate can include at least one of: an ultra-low resistivity material; a conductive metal with a suitable adhesion layer on the back-side; a conductive metal with a suitable adhesion layer on the front-side; an insulation layer that contains silicon, aluminum or a polymer on the front-side; an optional insulation layer having an etched rectangular geometry depending on etching depth, which can vary from zero to any suitable depth; and a substantially rectangular opening underneath an insulating layer, where the rectangular opening has a lateral size that is substantially the same as the insulating layer.

The column can be configured to connect to a target substrate having a portion formed of a substantially rigid (e.g., Silicon) or flexible material (e.g., paper or polymer). The column can include a matter generation/control substrate that includes: a nozzle formed in an etchable nozzle substrate, a reservoir configured to receive a precursor material comprised of solid, liquid, and/or gas phase substances, an e-lens, a first insulating layer between the e-lens and the etchable nozzle substrate, and a second insulating layer on the bottom side of the etchable nozzle substrate.

The column can include a droplet generation/control substrate that includes: a nozzle formed in an etchable nozzle substrate, a reservoir fillable with an etchant fluid or a nanoparticle ink, one or more droplet filaments, an e-lens, a first insulating layer between the e-lens and the etchable nozzle substrate, and a second insulating layer on the bottom side of the etchable nozzle substrate.

A nanodroplet printer constructed in accordance with the inventive principles and concepts disclosed herein can include a Scanning Nanodroplet Additive Printer-on-a-Chip (SNAP-Chip) configured via a dynamically reconfigurable single filament or a multi-filament nozzle. The printer can be configured to deliver on-demand, location-controlled nanodroplet extraction. The printer can be configured to print 3D patterns via the nozzle filament to a substrate in an additive or subtractive fashion.

The printer can be configured so that both the nozzle filament(s) and the substrate remain in a substantially stationary configuration during a printing procedure. The printer can include a droplet column formed within a droplet generation/control substrate and a target substrate. The printer can include an e-lens and a reservoir, where the width of the nozzle is less than or equal to a width of the e-lens, and where the width of the droplet filament is less than or equal to the width of the nozzle, and where the width of the e-lens is less than a width of the reservoir section of the printer.

The printer can be configured such that the width of the nozzle ranges from a few nanometers to 2000 nanometers, or any other suitable width, and the diameter of the droplet filament can range from a few nanometers to 2000 nm (e.g., about 2 nm), or any other suitable diameter. The width of the printed pattern can remain substantially the same as that of the droplet filament, if desired, and thereby represents printing at or near the limits of solid-state miniaturization.

The printer can be configured so that the inter-electrode separation of the e-lens ranges from 50 nm to 2000 nm, or other suitable separation distance, if desired. The printer can be configured such that the e-lens and the nozzle are disposed within a droplet column and separated by a suitable vertical distance, such as a distance ranging from 50 nanometers to 2000 nanometers, or other suitable distance depending on the application or process. The printer can be configured such that the e-lens and the nozzle are disposed within a droplet column and separated by a suitable horizontal distance, such as a distance ranging from zero nanometers to 2000 nanometers, such that applications requiring extreme miniaturization of the printer components can result in ultra-low deposition voltages (e.g., voltages as low as approximately 5 volts and up to approximately 100 volts).

In accordance with inventive principles and concepts disclosed herein, a nanodroplet printing system can be configured to precisely control meniscus sizing and to prevent electrical shorting of droplet filament with an e-lens. To this end, the nanodroplet printing system can include a nanoengineered surface roughness/texture at the nozzle "exit" sidewalls that increases hydrophobicity of the nozzle exit sidewalls. In accordance with one exemplary embodiment, the nozzle can have nanoscopically stepped exit sidewalls to increase hydrophobicity.

In accordance with one embodiment, the nano droplet printing system is configured to precisely control a surface-to-volume ratio of a droplet filament, via nozzle/meniscus sizing and/or electric fields, in order to prevent electrical shorting between the droplet filament and the e-lens. An increase in the surface tension reduces lateral deformation of the filament during droplet ejection and thereby prevents the droplet filament from wetting the nozzle "exit" sidewalls/the e-lens during a printing operation.

In accordance with one embodiment, the nanodroplet printing system is configured to reduce nozzle clogging with nanoparticles through dielectrophoretic de-clogging procedures, which are triggered with the application of an AC-bias to the nozzle relative to the e-lens.

In accordance with one embodiment, the nanodroplet printing system is configured to reduce nozzle clogging with nanoparticles through the use of a rectangular nozzle configuration in which the nozzle length is much larger than the nozzle width.

A printing system constructed in accordance with the inventive principles and concepts disclosed herein can include a single filament or multi-filament nozzle component configured to enable on-demand location controlled nanodroplet extraction. The printing system can include an e-lens module to exert an electric field at a nanoparticle ink. The printing system can be configured such that a target substrate can optionally carry a selectively applied bias to aid in droplet extraction/guidance from the filament. The system can be configured to operate at ambient temperature and pressure.

In an embodiment, a nanodroplet printing system can include system components configured to extract droplet(s) from a single filament pendant/positioned at the center of a nozzle opening. The e-lens can comprise either one pair of electrodes per nozzle or one set of radially arranged electrodes per nozzle to achieve self-alignment of droplet(s) when traversing from the filament to a target substrate and to print nanostructures on the target substrate.

In an embodiment, a nanodroplet printing system includes system components configured to extract droplet(s) from a single filament pendant/positioned at the center of a nozzle opening. The system can be configured to achieve mid-air control over the trajectory of droplet(s) via the selective polarization of a radially arranged set of e-lens electrodes in order to print nanostructures in 3D on a target substrate without moving the nozzle or the target substrate. The droplet filament can be formed at the nozzle in a self-aligned fashion with respect to the e-lens, where deposition, mixing or etching steps are achieved by the choice of selective bias voltage pattern.

In certain exemplary embodiments of the printer, the e-lens and the nozzle are disposed within a droplet column and are separated by a vertical distance ranging from 50 nm to 2000 nm. In certain exemplary embodiments of the printer, the e-lens and the nozzle are disposed within a droplet column and are separated by a horizontal distance ranging from zero nanometers to 2000 nanometers. Extreme miniaturization of the printer components can result in ultra-low deposition voltages (e.g., from 5 volts to 100 volts).

The system can be configured to include an array of e-lenses, where the e-lenses are positioned to be contiguous to and on both sides of a rectilinear nozzle opening in order to selectively and/or dynamically form one or more nanodroplet filaments on-demand within a single nozzle (i.e., to form a multi-filament nozzle), with spatial and temporal control, via the controlled polarization of selected electrodes in the e-lens array. The system can be configured for dynamically reconfigurable droplet ejection by controlling the electric signals applied to individual electrodes in the e-lens array in terms of signal location, duration, and/or other characteristic in order to form a custom printed pattern, etch, drug mixture, or other suitable result on a target substrate.

In accordance with the inventive principles and concepts disclosed herein, a printer can employ a nanoelectrohydrodynamic printing method comprising the steps of: applying a radially symmetric electric field on a nanoparticle ink at a nozzle tip, the radially symmetric electric field inducing self-aligned formation of a droplet filament at the nozzle tip, the radially symmetric electric field inducing self-aligned ejection and delivery of a droplet toward the target substrate, and repeating the applying step to form multiple and location-controlled, self-aligned droplet emission filaments on-demand and in a dynamically reconfigurable fashion within a multi-filament nozzle.

In accordance with an embodiment, a method of manufacturing a nanodroplet column and/or filament nozzle and/or nano droplet printer is provided that can include: etching a nozzle in an etchable nozzle substrate, where the nozzle configured to facilitate atomic-to-nanoscale matter emission/flow; forming an insulating layer; and forming an e-lens, where the diameter of the e-lens is greater than the diameter of the nozzle, and where the insulating layer is disposed between the nozzle and the e-lens.

In accordance with an embodiment, a SNAP-Chip printer includes the printer assembly and operation methodology including the following: loading of the reservoir with the nanoparticle ink while the droplet generation/control substrate is upside-down such that the e-lens is positioned at the bottom side; flipping the droplet generation/control substrate to its desired orientation, such as where the e-lens is positioned on the top side; placing the target substrate on top of the droplet ejection/control substrate and selectively aligning the two substrates using alignment markers under an optical microscope/aligner; and applying an electric field on the nanoparticle ink at the nozzle tip to form droplet filament(s), thereby enabling SNAP-Chip operation.

In accordance with an embodiment, the SNAP-Chip printer employs a printer biasing methodology for droplet ejection including the following steps: applying two distinct and independently controlled voltage signals to the e-lens and to the bulk of the target substrate with respect to the nanoparticle ink; or applying an electrical bias only to the bulk of the target substrate with respect to the nanoparticle ink, while the e-lens is held at a floating potential; or applying an electrical bias only to the bulk of the target substrate with respect to the nanoparticle ink, while the e-lens is electrically shorted to the target substrate via direct physical contact.

A column constructed in accordance with the inventive principles and concepts herein can include a second insulating layer with a suitably shaped opening, such as a rectangular opening or other shape, where the opening measures dimensions that are substantially the same as that of the bottom-side opening of the etchable nozzle substrate.

A nanodroplet printer can be configured to perform biasing steps to deposit, etch or mix as needed in a particular application.

In accordance with an embodiment, the SNAP-Chip printer includes an array of printers formed in a single monolithic substrate for scalable and parallel printing/etching of patterns on a target substrate, which may extend in size to up to full wafers used in the semiconductor industry.

A process for manufacturing an atomic-to-nanoscale matter emission/flow regulation systems and/or devices can include: depositing an insulating film on a top and bottom of an etchable substrate; forming one or more openings on the top of the substrate; providing an adhesion layer and substrate contact metallization layer at the one or more openings; forming a bottom opening in the bottom insulating layer; forming a reservoir or bottom via the bottom opening. The openings and reservoir can be formed using a wet or dry etching process, or other suitable process. The process can include the steps of: forming an e-lens micro-to-nanoscopically sized electrodes with varying designs and inter-electrode widths on top of the insulating layer at the top-side of the substrate, where the e-lens comprises a stack of adhesion and functional metal layers; etching the insulating layer on the top-side of the substrate to form an opening enveloping the inter-electrode gap regions of the e-lens; and/or simultaneously etching the substrate from the top- and back-sides to form the nozzle.

Other features, geometries, applications, and embodiments not specifically set forth are contemplated within the scope of the present disclosure, including materials, arrangements and other modifications that enable substantially the same function(s) of the processes and devices set forth and/or described or achievable in accordance with the principles of the present disclosure.

It should be noted that the inventive principles and concepts have been described with reference to representative embodiments, but that the inventive principles and concepts are not limited to the representative embodiments described herein. Although the inventive principles and concepts have been illustrated and described in detail in the drawings and in the foregoing description, such illustration and description are to be considered illustrative or exemplary and not restrictive; the invention is not limited to the disclosed embodiments. For example, column configurations other than those shown in the figures may be used. Other variations to the disclosed embodiments can be understood and effected by those skilled in the art, from a study of the drawings, the disclosure, and the appended claims.

What is claimed is:

1. An atomic-to-nanoscale matter emission/flow regulation device, comprising:
at least a first nanodroplet generation/control device having a front side, a back side and a first reservoir disposed in between the front side and the back side, the first reservoir configured for holding matter to be extracted from the first reservoir, the first nanodroplet generation/control device comprising at least a first nanodroplet column system comprising:

an upper portion of the first reservoir;

a first electrostatic lens (e-lens) disposed in between the upper portion of the first reservoir and the front side of the first nanodroplet generation/control device, the first e-lens including at least a first set of at least first and second electrodes that are laterally separated from one another by a first lateral gap having a gap width; and a first nozzle disposed in between the first e-lens and the upper portion of the first reservoir and having a first nanodroplet orifice through which nanodroplets are generated from matter held in the first reservoir, the first nanodroplet orifice being separated from the first e-lens by a first e-lens-to-filament base gap extending between an adhesion layer of the first e-lens and the first nanodroplet orifice, where the nanodroplets generated from the matter held in the first reservoir are extracted out of the first reservoir through the first nanodroplet orifice when a first set of preselected voltage signals are applied to the first set of at least first and second electrodes, the first nozzle being precisely aligned with the first lateral gap and having a first nozzle width equal to a distance between innermost edges of side walls of the first nozzle, the first nozzle and the first lateral gap having a common central axis that ensures that the nanodroplets extracted through the first nanodroplet orifice self-align with the first lateral gap, the first nozzle width being less than or equal to 300 nanometers.

2. The atomic-to-nanoscale matter emission/flow regulation device of claim 1, wherein the first nozzle width is less than or equal to 150 nanometers.

3. The atomic-to-nanoscale matter emission/flow regulation device of claim 2, wherein the e-lens-to-filament base gap is less than or equal to 500 nanometers in length, or less than or equal to 100 nanometers in length.

4. The atomic-to-nanoscale matter emission/flow regulation device of claim 1, wherein the atomic-to-nanoscale matter emission/flow regulation device is an integrated device disposed in a semiconductor chip or a semiconductor wafer.

5. The atomic-to-nanoscale matter emission/flow regulation device of claim 4, wherein the semiconductor chip or wafer comprises:

a first substrate comprising a first semiconductor material, the first substrate having a back side and a front side corresponding to the back side and the front side, respectively, of the first nanodroplet generation/control device, the first reservoir extending from the backside of the first substrate to an inlet of the first nozzle, the first nozzle being formed in the front side of the first substrate, the first nozzle having an exit side having side walls that extend away from the central axis of the first nozzle;

one or more first layers of insulation disposed on the front side of the first substrate, said one or more first layers of insulation forming the first e-lens-to-filament base gap and separating the first e-lens from the first nozzle by a distance equal to a length of the first e-lens-to-filament base gap, wherein an opening in said one or more first layers of insulation has a width equal to the gap width of the first lateral gap and extends from top edges of the side walls of the first nozzle; and one or more first metal layers disposed on a top surface of said one or more first layers of insulation, wherein said one or more first metal layers have an opening therein that is laterally aligned with the opening in the first layer of insulation to form the first lateral gap, wherein portions of said one or more first metal layers disposed on opposite sides of the lateral gap comprise said at least first and second electrodes of the first set of at least first and second electrodes.

6. The atomic-to-nanoscale matter emission/flow regulation device of claim 4, wherein the semiconductor chip or wafer has at least a first set of terminals that are accessible external to the semiconductor chip or wafer and electrically coupled to said at least a first set of at least first and second electrodes to allow a first set of preselected voltage signals to be applied to said at least a first set of electrodes.

7. The atomic-to-nanoscale matter emission/flow regulation device of claim 6, further comprising:

a controller that is external to the semiconductor chip or wafer and electrically coupled to said at least a first set of at least first and second electrodes, the controller being configured to control the first set of preselected voltages to cause nanodroplets extracted through the first nanodroplet orifice to be directed along the common central axis away from the first nanodroplet orifice or to be deflected in-flight in at least one of an X-direction and a Y-direction, the X- and Y-directions being perpendicular to the common central axis.

8. The atomic-to-nanoscale matter emission/flow regulation device of claim 7, wherein the first nozzle is a multifilament nozzle having at least first and second filaments arranged in a lengthwise direction of the first nozzle, the lengthwise direction being perpendicular to the widthwise direction of the first nozzle by a first nozzle length that is greater than the first nozzle width, and wherein said at least a first set of at least first and second electrodes comprises at least first and second sets of at least first and second electrodes, the first and second electrodes of the first set of at least first and second electrodes being disposed on opposite sides of the first filament, the first and second electrodes of the second set of at least first and second electrodes being disposed on opposite sides of the second filament, and wherein said said first set of terminals comprises at least first and second terminals that are electrically coupled to the first and second electrodes, respectively, of the first set of electrodes, and wherein said second set of terminals comprises at least first and second terminals that are electrically coupled to the first and second electrodes, respectively, of the second set of electrodes, and wherein the controller is electrically coupled to said at least first and second sets of terminals to allow first and second sets of preselected voltage signals to be independently applied to the first and second sets of electrodes, respectively, the controller being configured to control the first and second sets of preselected voltages to cause nanodroplets to be extracted through the nanodroplet orifice.

9. The atomic-to-nanoscale matter emission/flow regulation device of claim 4, wherein the semiconductor chip or wafer comprises:

at least a second nanodroplet generation/control device having a front side, a back side and a second reservoir disposed in between the front side and the back side of the second nanodroplet generation/control device for holding matter comprising nanoparticles, the second nanodroplet generation/control device comprising at least a second nanodroplet column system comprising:

an upper portion of the second reservoir;

a second e-lens disposed in between the upper portion of the second reservoir and the front side of the second nanodroplet generation/control device, the second e-lens including at least a second set of at least first and second electrodes that are laterally separated from one another by a second lateral gap having a second gap width; and a second nozzle disposed in between the second e-lens and the upper portion of the second reservoir and being separated from the second e-lens by a second e-lens-to-filament base gap, the second nozzle having a second nanodroplet orifice through which nanodroplets generated from matter held in the second reservoir are extracted out of the second reservoir through the second nanodroplet orifice when a second set of preselected voltage signals are applied to the second set of at least first and second electrodes, the second nozzle being precisely aligned with the second lateral gap and having a second nozzle width equal to a distance between innermost edges of side walls of the second nozzle, the second nozzle and the second lateral gap having a common central axis that ensures that the nanodroplets extracted through the second nanodroplet orifice self-align with the second lateral gap, the second nozzle width being less than or equal to 300 nanometers.

10. The atomic-to-nanoscale matter emission/flow regulation device of claim 9, wherein the semiconductor chip or wafer comprises:

a first substrate comprising a first semiconductor material, the first substrate having a back side and a front side corresponding to the back side and the front side, respectively, of the first and second nanodroplet generation/control devices, the first and second reservoirs extending from the backside of the chip substrate to the inlets of the first and second nozzles, the first and second nozzles being formed in the front side of the first substrate, the first and second nozzles having respective exit sides having side walls that extend away from the central axes of the first and second nozzles, respectively;

one or more first layers of insulation disposed on the front side of the first substrate, said one or more first layers of insulation forming the first and second e-lens-to-filament base gaps and separating the first and second e-lenses from the first and second nozzles, respectively, by a distance equal to a length of the first and second e-lens-to-filament base gaps, respectively, wherein first and second openings in said one or more first layers of insulation have first and second widths, respectively, equal to the first and second gap widths, respectively, and extend from top edges of the side walls of the first and second nozzles, respectively; and one or more first metal layers disposed on a top surface of said one or more first layers of insulation, wherein said one or more first metal layers have first and second openings therein that are laterally aligned with the first and second openings, respectively, in said one or more first layers of insulation to form the first and second lateral gaps, respectively, wherein portions of said one or more first metal layers disposed on opposite sides of the first and second lateral gaps comprise the first and second sets, respectively, of at least first and second electrodes.

11. The atomic-to-nanoscale matter emission/flow regulation device of claim 9, wherein the first nozzle is a multi-filament nozzle having at least first and second filaments arranged in a lengthwise direction of the first nozzle, wherein the first nozzle extends in a lengthwise direction that is perpendicular to the widthwise direction of the first nozzle by a first nozzle length that is greater than the first nozzle width, and wherein said at least a first set of at least first and second electrodes comprises at least first and second sets of at least first and second electrodes, the first and second electrodes of the first set of at least first and second electrodes being disposed on opposite sides of the first filament, the first and second electrodes of the second set of at least first and second electrodes being disposed on opposite sides of the second filament, and wherein said first set of terminals comprises at least first and second terminals that are electrically coupled to the first and second electrodes, respectively, of the first set of electrodes, and wherein said second set of terminals comprises at least first and second terminals that are electrically coupled to the first and second electrodes, respectively, of the second set of electrodes, and wherein the controller is electrically coupled to said at least first and second sets of terminals to allow first and second sets of preselected voltage signals to be independently applied to the first and second sets of electrodes, respectively, the controller being configured to control the first and second sets of preselected voltages to cause nanodroplets to be extracted through the nanodroplet orifice.

12. The atomic-to-nanoscale matter emission/flow regulation device of claim 1, wherein the side walls of the first nozzle are sloped or stepped.

13. A method for printing metal structures on a printable substrate, the method comprising:

providing a first nanodroplet printer comprising at least a first nanodroplet column system comprising an upper portion of a first reservoir, a first electrostatic lens (e-lens), a first nozzle having a first nozzle width equal to a distance between innermost edges of side walls of the first nozzle, and a first layer of insulation material disposed in between the first e-lens and the first nozzle, the first nozzle disposed in between the first e-lens and the upper portion of the first reservoir and having a nanodroplet orifice through which nanodroplets are generated from matter held in the first reservoir, the nanodroplet orifice being separated from a first e-lens-to-filament base gap extending between the first e-lens and the nanodroplet orifice, the first reservoir having matter therein to be extracted, the first nozzle having an inlet side disposed in the upper portion of the first reservoir and an exit side disposed in the first e-lens-to-filament base gap, the exit side of the first nozzle having side walls that extend away from a common central axis of the first nozzle and the first e-lens, centers of the first nozzle and the first e-lens being precisely aligned along the common central axis such that there is substantially zero misalignment between the centers of the first nozzle and the first e-lens, the first e-lens including at least a first set of at least first and second electrodes that are laterally separated from one another by a first lateral gap having a first gap width, wherein the printable substrate is mounted on a front side of the first nanodroplet printer in alignment with the first nanodroplet printer; and applying a first set of voltage signals to the first set of at least first and second electrodes to cause a nanodroplet to be generated and extracted through the nanodroplet orifice of the first nozzle, the extracted nanodroplet self-aligning to the e-lens due to the first nozzle and the first e-lens being precisely aligned along the common central axis, the e-lens directing the extracted nanodroplet onto the printable substrate to thereby write a structure on the printable substrate.

14. The method of claim 13, wherein the first nozzle has a first nozzle width equal to a distance between innermost edges of the side walls of the first nozzle, the first nozzle width being less than or equal to 10 nanometers.

15. The method of claim 14, wherein the first nanodroplet printer is integrated into a semiconductor chip or wafer that has at a least first set of terminals that are accessible external to the semiconductor chip or wafer and that are electrically coupled to the first set of at least first and second electrodes, and wherein the applying step comprises applying the first set of preselected voltage signals to the first set of electrodes to cause the nanodroplet extracted through the nanodroplet orifice to be directed along common central axis or to be deflected in-flight in at least one of an X-direction and a Y-direction, the X- and Y-directions being perpendicular to the common central axis.

16. The method of claim 13, wherein the method performed by the first nanodroplet printer is an additive method, the nanodroplets comprising metal particles and a solvent, wherein after the extracted nanodroplet comes into contact with the printable substrate, the solvent evaporates leaving the metal particle on the printable substrate to form the written structure, and wherein the step of applying the first set of bias voltage signals is repeated until the written structure is a preselected three-dimensional (3D) structure.

17. The method of claim 13, wherein the method performed by the first nanodroplet printer is a subtractive method used to perform lithography in a semiconductor fabrication process to pattern a layer of resist disposed on a surface of the target substrate, the nanodroplets comprising a solvent that dissolves the resist when the nanodroplet comes into contact with the resist, or used to etch a layer of material disposed on a surface of the target substrate, the nanodroplets comprising an etchant that etches the material when the nanodroplet comes into contact with the material.

18. The method of claim 17, wherein the matter in the reservoir is a gas that etches the material when the nanodroplet comes into contact with the material.

19. The method of claim 14, where the first nozzle width results in nandroplets that are smaller than 10 nanometers, and wherein nanodroplets that are ten times smaller than the first nozzle width can be extracted from the nozzle.

\* \* \* \* \*